United States Patent
Hayami

(10) Patent No.: US 6,297,753 B1
(45) Date of Patent: Oct. 2, 2001

(54) EIGHT-TO-FIFTEEN MODULATION USING NO MERGING BIT AND OPTICAL DISC RECORDING OR READING SYSTEMS BASED THEREON

(75) Inventor: Atsushi Hayami, Yokohama (JP)

(73) Assignee: Victor Company of Japan, Ltd., Yokohama (JP)

( * ) Notice: Subject to any disclaimer, the term of this patent is extended or adjusted under 35 U.S.C. 154(b) by 0 days.

(21) Appl. No.: 09/489,609

(22) Filed: Jan. 21, 2000

(30) Foreign Application Priority Data

Jan. 29, 1999 (JP) .................................................. 11-023316

(51) Int. Cl.$^7$ ...................................................... H03M 7/00
(52) U.S. Cl. .................................. 341/59; 341/55; 341/68
(58) Field of Search .................................... 341/59, 58, 55, 341/68

(56) References Cited

U.S. PATENT DOCUMENTS

| | | | |
|---|---|---|---|
| 5,696,505 | * | 12/1997 | Schouhamer-Immink .............. 341/59 |
| 5,731,768 | * | 3/1998 | Tseng ....................................... 341/59 |
| 5,742,243 | * | 4/1998 | Moriyama ............................... 341/59 |
| 5,870,703 | * | 2/1999 | Okazaki et al. ........................ 341/59 |
| 5,969,649 | * | 10/1999 | Ashley et al. ........................... 341/59 |
| 6,046,691 | * | 4/2000 | Aziz et al. .............................. 341/58 |
| 6,104,324 | * | 8/2000 | Kim ....................................... 341/58 |

FOREIGN PATENT DOCUMENTS

| | | |
|---|---|---|
| 8-31100 | 2/1996 | (JP) . |
| 8-77717 | 3/1996 | (JP) . |
| 8-149013 | 6/1996 | (JP) . |

OTHER PUBLICATIONS

"EFMPlus: The Coding Format of the Multimedia Compact Disc" by K.A.S. Immink; IEEE Trans. C.E. vol.41, No.3; Aug., 1995; pp., 491–497.

"Finite–State Modulation Codes for Data Storage" by B. H. Marcus et al.; U.S. IEEE J.on Selected Areas in Communications vol. 10, No. 1; Jan., 1992; pp., 5–27.

* cited by examiner

Primary Examiner—Peguy JeanPierre
Assistant Examiner—Jean Bruner Jeanglaude
(74) Attorney, Agent, or Firm—Israel Gopstein

(57) ABSTRACT

A p-to-q (p<q) code table, and a p-to-q modulation method and system that uses the table and provides a q-bit code stream satisfying a predetermined RLL constraints and the DSV constraint and including no merging bit are provided. The table comprises a plurality of subtables with respective ID's. Each q-bit code in the table is accompanied with a field containing a subtable ID for the modulation of the next code. Codes can be used repeatedly in each subtable such that combinations of appearances of each of the overlapping codes and respective fields are unique in the subtable. The table includes at least one group of a first subtable and at least one second subtable such that the first subtable can be used for the second subtable(s) for the codes of the $2^p$ codes that are in a predetermined range and that, for each code in the predetermined range, the number of "1" symbols of two corresponding codes of the first subtable and each of the second subtable(s) is an odd number, which enables DSV control. In modulation, a q-bit code for the current p-bit code is retrieved from a subtable identified by the value of the above-mentioned field that accompanies the q-bit code used for the previous p-bit code. If two subtables are usable, one yielding a smaller DSV absolute value is used.

21 Claims, 19 Drawing Sheets

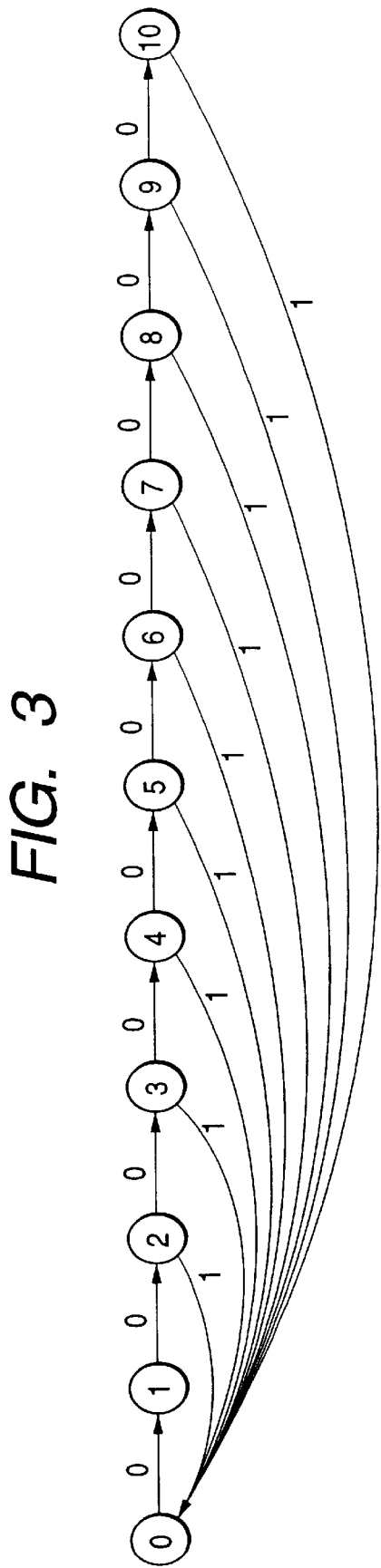

FIG. 4A

| | 01 | 02 | 11 | 12 | 13 | 61 | 62 | 63 | 64 | 81 | 82 | 83 | 91 | 92 | 10 |
|---|---|---|---|---|---|---|---|---|---|---|---|---|---|---|---|
| 001 | 00017 | 01025 | 00033 | 01025 | 04169 | 04169 | 01025 | 08713 | 16905 | 04169 | 08713 | 16905 | 08713 | 16905 | 16905 |
| 002 | 00033 | 01033 | 00065 | 01033 | 04225 | 04225 | 01033 | 08721 | 16913 | 04225 | 08721 | 16913 | 08721 | 16913 | 16913 |
| 003 | 00065 | 01041 | 00073 | 01041 | 04233 | 04233 | 01041 | 08737 | 16929 | 04233 | 08737 | 16929 | 08737 | 16929 | 16929 |
| 004 | 00073 | 01057 | 00129 | 01057 | 04241 | 04241 | 01057 | 08769 | 16961 | 04241 | 08769 | 16961 | 08769 | 16961 | 16961 |
| 005 | 00129 | 01089 | 00137 | 01089 | 04353 | 04353 | 01089 | 08777 | 16969 | 04353 | 08777 | 16969 | 08777 | 16969 | 16969 |
| 006 | 00137 | 01097 | 00145 | 01097 | 04361 | 04361 | 01097 | 09217 | 17403 | 04361 | 09217 | 17403 | 09217 | 17403 | 17403 |
| 007 | 00145 | 01153 | 00257 | 01153 | 04369 | 04369 | 01153 | 09225 | 17417 | 04369 | 09225 | 17417 | 09225 | 17417 | 17417 |
| 008 | 00257 | 01161 | 00265 | 01161 | 04385 | 04385 | 01161 | 09233 | 17425 | 04385 | 09233 | 17425 | 09233 | 17425 | 17425 |
| 009 | 00265 | 01169 | 00273 | 01169 | 04609 | 04609 | 01169 | 09249 | 17441 | 04609 | 09249 | 17441 | 09249 | 17441 | 17441 |
| 010 | 00273 | 02043 | 00289 | 02043 | 04617 | 04617 | 02043 | 09281 | 17473 | 04617 | 09281 | 17473 | 09281 | 17473 | 17473 |
| 011 | 00289 | 02057 | 00513 | 02057 | 04625 | 04625 | 02057 | 09289 | 17481 | 04625 | 09289 | 17481 | 09289 | 17481 | 17481 |
| 012 | 00513 | 02065 | 00521 | 02065 | 04641 | 04641 | 02065 | 09345 | 17537 | 04641 | 09345 | 17537 | 09345 | 17537 | 17537 |
| 013 | 00521 | 02081 | 00529 | 02081 | 04673 | 04673 | 02081 | 09358 | 17545 | 04673 | 09358 | 17545 | 09358 | 17545 | 17545 |
| 014 | 00529 | 02113 | 00545 | 02113 | 04681 | 04681 | 02113 | 09361 | 17553 | 04681 | 09361 | 17553 | 09361 | 17553 | 17553 |
| 015 | 00545 | 02121 | 00577 | 02121 | 08201 | 08201 | 02121 | 06393 | 18433 | 08201 | 06393 | 18433 | 06393 | 18433 | 18433 |
| 016 | 00577 | 02177 | 00585 | 02177 | 08209 | 08209 | 02177 | 06401 | 18441 | 08209 | 06401 | 18441 | 06401 | 18441 | 18441 |
| ... | ... | ... | ... | ... | ... | ... | ... | ... | ... | ... | ... | ... | ... | ... | ... |

FIG. 4B

| SUBTABLE | NEW SUBTABLE |
|---|---|
| 01 | 0 |
| 02=12=62 | 1 |
| 11 | 2 |
| 13=61=81 | 3 |
| 63=91 | 4 |
| 64=83=92=10 | 5 |
| 82 | 6 |

FIG. 5A

| SOURCE CODE | SUBTABLE 0 | SUBTABLE 1 | SUBTABLE 2 | SUBTABLE 3 | SUBTABLE 4 | SUBTABLE 5 | SUBTABLE 6 |
|---|---|---|---|---|---|---|---|
| 000 | 00000000100000 4 | 00100010000000 6 | 00000000100000 4 | 00000000100000 4 | 01000010000000 4 | 10000100000000 4 | 01000010000000 6 |
| 001 | 00000000100000 5 | 00100010000000 3 | 00000000100000 5 | 00000000100000 5 | 01000010000000 5 | 10000100000000 5 | 01000010000000 3 |
| 002 | 00000000100001 0 | 00000010000001 0 | 00000000100001 0 | 00000000100001 0 | 01000010001001 0 | 10000100001000 1 | 01001001001001 0 |
| 003 | 00000000100001 1 | 00000010000001 1 | 00000000100001 1 | 00000000100001 1 | 01001001001001 1 | 10000100001000 3 | 01001001001001 1 |
| 004 | 00000000100100 1 | 00000010000010 2 | 00000000100100 1 | 00000000100100 1 | 01001001001010 1 | 10000100001000 4 | 01001001010010 0 |
| 005 | 00000000100100 3 | 00000010000010 3 | 00000000100100 3 | 00000000100100 3 | 01001001010010 3 | 10000100001001 0 | 01001001010010 1 |
| 006 | 00000000100100 4 | 00000010000010 4 | 00000000100100 4 | 00000000100100 4 | 01001001010010 4 | 10000100001001 1 | 01001001010010 4 |
| 007 | 00000000100100 5 | 00000010000100 1 | 00000000100100 5 | 00000000100100 5 | 01001001010010 5 | 10000100001001 0 | 01001001010010 5 |
| 008 | 00000001000000 3 | 00000010000100 3 | 00000001000000 3 | 00000001000000 3 | 01001001000100 1 | 10000100010000 3 | 01001001010010 1 |
| 009 | 00000001000000 4 | 00000010000100 4 | 00000001000000 4 | 00000001000000 4 | 01001001000100 3 | 10000100010000 4 | 01001001000100 3 |
| 010 | 00000001000001 5 | 00000010001000 5 | 00000001000001 5 | 00000001000001 5 | 01001001000100 5 | 10000100010000 5 | 01001001000100 4 |
| 011 | 00000001001000 3 | 00000010001000 3 | 00000001001000 3 | 00000001001000 3 | 10000000001000 3 | 10000100010001 0 | 01001001000100 5 |
| 012 | 00000001001000 4 | 00000010001000 4 | 00000001001000 4 | 00000001001000 4 | 10000000001000 4 | 10000100010001 1 | 10000000001000 3 |
| 013 | 00000001001000 5 | 00000010001000 5 | 00000001001000 5 | 00000001001000 5 | 10000000001000 5 | 10000000000001 0 | 10000000001000 4 |
| 014 | 00000001001000 1 | 00000010001001 0 | 00000001001000 1 | 00000001001000 1 | 10000000010000 3 | 10000000000001 1 | 10000000001000 5 |
| 015 | 00000001001000 5 | 00000010001001 1 | 00000001001000 5 | 00000001001000 5 | 10000000010000 4 | 10000000010010 2 | 10000000010000 4 |
| 016 | 00000001001001 0 | 00000010010010 2 | 00000001001001 0 | 00000001001001 0 | 10000000010000 5 | 10000000010010 3 | 10000000010001 0 |
| 017 | 00000001001001 1 | 00000010010010 3 | 00000001001001 1 | 00000001001001 1 | 10000000010001 0 | 10000000010010 4 | 10000000010001 1 |
| 018 | 00000010010010 2 | 00000010010010 4 | 00000010010010 2 | 00000010010010 2 | 10000000010001 1 | 10000000000001 0 | 10000000010010 2 |
| 019 | 00000010010010 3 | 00000010001000 4 | 00000010010010 3 | 00000010010010 3 | 10000001000100 2 | 10000000000001 1 | 10000000010010 3 |
| 020 | 00000010010010 4 | 00000010001000 5 | 00000010010010 4 | 00000010010010 4 | 10000001000100 3 | 10000000001000 3 | 10000000010010 4 |
| 021 | 00000010010010 5 | 00000100010001 0 | 00000010010010 5 | 00000010010010 5 | 10000001000100 5 | 10000000100000 5 | 10000000010010 5 |
| 022 | 00000010001001 0 | 00000100010001 1 | 00000010001001 0 | 00000010001001 0 | 10000001001000 0 | 10000001000001 1 | 10000001000001 1 |
| 023 | 00000010001001 1 | 00000100100010 1 | 00000010001001 1 | 00000010001001 1 | 10000001001000 1 | 10000001000010 1 | 10000001000010 1 |
| 024 | 00000010010001 0 | 00000100100010 2 | 00000010010001 0 | 00000010010001 0 | 10000001001001 0 | 10000001000010 2 | 10000001000100 0 |
| 025 | 00000010010001 1 | 00000100100010 3 | 00000010010001 1 | 00000010010001 1 | 10000001001001 1 | 10000001000010 3 | 10000001000100 1 |
| 026 | 00000010010010 3 | 00000100100100 3 | 00000010010010 3 | 00000010010010 3 | 10000100001000 3 | 10000001001000 3 | 10000100001000 3 |
| 027 | 00000010010100 3 | 00000100100100 4 | 00000010010100 3 | 00000010010100 3 | 10000100010000 4 | 10000001001000 4 | 10000100010000 3 |
| 028 | 00000100100100 4 | 00000100100100 5 | 00000100100100 4 | 00000100100100 4 | 10000100010000 5 | 10000001000100 3 | 10000100010000 4 |
| 029 | 00000100100100 5 | 00001000100010 1 | 00000100100100 5 | 00000100100100 5 | 01001001001001 0 | 10000001000100 4 | 10000100010000 5 |
| 030 | 00001000100001 0 | 00001000100010 3 | 00001000100001 0 | 00001000100001 0 | 01001001001001 1 | 10000001000100 5 | 01001001001001 0 |
| 031 | 00001000100001 1 | 00001000100010 4 | 00001000100001 1 | 00001000100001 1 | 01001001001010 2 | 10000001001000 3 | 01001001001001 1 |
| 032 | 00001000100010 2 | 00001000100100 3 | 00001000100010 2 | 00001000100010 2 | 01001001001010 3 | 10000001001000 4 | 01001001001010 2 |
| 033 | 00001000100010 3 | 00001000100100 4 | 00001000100010 3 | 00001000100010 3 | 01001001001010 4 | 10000001001000 5 | 01001001001010 3 |
| 034 | 00001000100100 1 | 00001000100100 5 | 00001000100100 1 | 00001000100100 1 | 01001001010010 1 | 10000100010000 1 | 01001001010010 1 |
| 035 | 00001000100100 3 | 00001000100100 1 | 00001000100100 3 | 00001000100100 3 | 01001001010010 3 | 10000100010010 1 | 01001001010001 3 |
| 036 | 00001000100100 4 | 00001000100100 3 | 00001000100100 4 | 00001000100100 4 | 01001001010010 4 | 10000100010010 2 | 01001001010001 4 |
| 037 | 00001000100100 4 | 00001000100100 4 | 00001000100100 4 | 00001000100100 4 | 01001001010001 4 | 10000100010010 3 | 01001001001000 4 |
| 038 | 00001000100100 5 | 00001000100100 5 | 00001000100100 5 | 00001000100100 5 | 01001001001000 5 | 10000100001000 3 | 01001001001000 5 |

| | | | | |
|---|---|---|---|---|
| 239 | 00100010000000010 2 | 00100000001001000 4 | 00100100000010010 2 | 01001000100010001 1 | 01001000010100100 4 |
| 240 | 00100010000000010 3 | 00100000001001000 5 | 01001000100010 3 | 01001000010000100 5 | 01001000010010 5 |
| 241 | 00100010000000100 1 | 00100000001000000 1 | 01001000100010010 1 | 01001000100010010 1 | 01001000010001000 1 |
| 242 | 00100010000000100 3 | 00100000001000000 3 | 01001000100010000 3 | 01001000100010000 3 | 01001000100010000 3 |
| 243 | 00100010000000100 4 | 00100000001000000 4 | 01001000100010000 4 | 01001000100010000 4 | 01001000100010000 4 |
| 244 | 00100010000000100 5 | 00100000001000000 5 | 01001000010000001 5 | 01001000100010000 5 | 01001000100010000 5 |
| 245 | 00100010000001000 1 | 00100000001000000 1 | 01001000010001000 1 | 01001000100010000 1 | 01001000100010000 1 |
| 246 | 00100010000001000 3 | 00100000001000000 3 | 01001000010001000 3 | 01001000100010000 3 | 01001000100010000 3 |
| 247 | 00100010000001000 4 | 00100000001000000 4 | 01001000010001000 4 | 01001000100010001 4 | 01001000100010001 4 |
| 248 | 00100010000001000 5 | 00100000001000001 5 | 01001000010001000 5 | 01001000100010001 5 | 01001000100010001 5 |
| 249 | 00100010000001000 0 | 00100000001000010 0 | 01001000010001000 0 | 01001000100010010 0 | 01001000100010010 0 |
| 250 | 00100010000001001 1 | 00100000001000010 1 | 01001000010001001 1 | 01001000100100010 1 | 01001000100100010 1 |
| 251 | 00100010000001001 2 | 00100000001000010 2 | 01001000010001001 2 | 01001000100100010 2 | 01001000100100010 2 |
| 252 | 00100010000010000 3 | 00100000001000100 3 | 01001000010010000 3 | 01001000100100100 3 | 01001000100100100 3 |
| 253 | 00100010000010000 4 | 00100000001000100 4 | 01001000100000000 4 | 01001000100100100 4 | 01001000100100100 4 |
| 254 | 00100010000010000 5 | 00100000001000100 5 | 01001000100000000 5 | 01001000100100100 5 | 01001000100100100 5 |
| 255 | 00100010000000000 5 | 00100000001000100 5 | 01001000010010000 5 | 01001000100100100 5 | 01001000100100100 5 |

\* 0000100000000000 5 IF LSB 0-RUN LENGTH OF PREVIOUS DATA IS NOT MORE THAN 6
\* 0100100000000000 5 IF LSB 0-RUN LENGTH OF PREVIOUS DATA IS NOT MORE THAN 7

FIG. 9

| STATE CODE | CONDITIONAL EXPRESSIONS IN C LANGUAGE |
|---|---|
| 0 | $(C_k <= 1024)$ || $(C_k >= 4168)$ && $(C_k != 4224)$ |
| 1 | $(1025 < C_k <= 4164)$ || $(C_k == 4224)$ |
| 2 | $(C_k <= 585)$ || $(C_k >= 8712)$ || $(C_k == 8704)$ |
| 3 | if (Type==2) {<br>    $(C_k <= 585)$ || $(C_k == 1024)$ || $(C_k == 9216)$ || $(4168 <= C_k <= 8708)$ && $(C_k != 4224)$ && $(C_k != 8704)$ }<br>else {<br>    $(C_k == 1024)$ || $(C_k == 9216)$ || $(4168 <= C_k <= 8708)$ && $(C_k != 4224)$ && $(C_k != 8704)$ } |
| 4 | $(C_k == 8704)$ || $(8712 <= C_k <= 16900)$ && $(C_k != 16896)$ |
| 5 | $(C_k == 16896)$ || $(C_k >= 16904)$ |
| 6 | $(C_k == 4224)$ || $(8712 <= C_k <= 16900)$ && $(C_k != 16896)$ && $(C_k != 9216)$ |

$C_k$ IS THE NEXT 15-BIT CODE OF THE CURRENT CODE $C_{k-1}$

FIG. 10

| 15-bit CODE $C_k$ | | NO. OF SUBTABLE FEOM WHICH $C_k$ WAS DERIVED (THE STATE OF $C_k$) | | | | | | | |
|---|---|---|---|---|---|---|---|---|---|
| DECIMAL | BINARY | 0 | 1 | 2 | 3 TYPE 2 | 3 OTHERS | 4 | 5 | 6 |
| 585 | 000001001001001 | | | | | | | | |
| 1024 | 000010000000000 | | | | ● | ● | | | |
| 1025 | 000010000000001 | | | | | | | | |
| 4164 | 001000001000100 | | | | | | | | |
| 4168 | 001000001001000 | | | | | | | | |
| 4224 | 001000010000000 | ○ | ● | | ○ | ○ | | | ● |
| 8704 | 010001000000000 | | | ● | ○ | ○ | ● | | |
| 8708 | 010001000000100 | | | | | | | | |
| 8712 | 010001000001000 | | | | | | | | |
| 9216 | 010010000000000 | | | | ● | ● | | | ○ |
| 16896 | 100001000000000 | | | | | | ○ | ● | ○ |
| 16900 | 100001000000100 | | | | | | | | |
| 16904 | 100001000001000 | | | | | | | | |

FIG. 14

| DECIMAL | 15-BIT CODE C<sub>k-1</sub> BINARY | E-TYPE | \multicolumn{7}{c}{THE STATE OF FOLLOWING CODE C<sub>k</sub> AND DECODED DATA} |

| DECIMAL | BINARY | E-TYPE | 0 | 1 | 2 | 3 | 4 | 5 | 6 |
|---|---|---|---|---|---|---|---|---|---|
| 16 | 000000000010000 | 2 | — | 157 | — | 158 | 159 | 160 | — |
| 17 | 000000000010001 | 0 | 161 | 162 | — | — | — | — | — |
| 18 | 000000000010010 | 1 | — | 163 | 164 | 165 | — | — | — |
| 32 | 000000000100000 | 2 | — | — | — | — | — | 1 | — |
| 33 | 000000000100001 | 0 | 2 | 3 | 60 | 61 | — | — | — |
| 34 | 000000000100010 | 1 | — | 59 | — | 5 | 6 | 7 | — |
| 36 | 000000000100100 | 2 | — | 4 | — | 9 | 10 | 11 | — |
| 64 | 000000001000000 | 2 | 39 | 8 | — | — | — | — | — |
| 65 | 000000001000001 | 0 | — | 40 | 42 | 43 | — | 65 | — |
| 66 | 000000001000010 | 1 | — | 41 | — | 63 | 64 | — | — |
| 68 | 000000001000100 | 2 | — | 62 | — | — | — | — | — |
| · | · | · | · | · | · | · | · | · | · |
| 8704 | 010001000000000 | 3 | — | — | — | — | — | 1 | · |
| · | · | · | · | · | · | · | · | · | · |
| 16904 | 100010000001000 | 2 | — | — | — | · | 0 | · | — |
| · | · | · | · | · | · | · | · | · | · |
| 18722 | 100100100000010 | 1 | — | 249 | 250 | 251 | · | · | — |
| 18724 | 100100100000100 | 2 | — | 252 | — | 253 | 254 | 255 | — |

306

EIGHT-TO-FIFTEEN MODULATION USING NO MERGING BIT AND OPTICAL DISC RECORDING OR READING SYSTEMS BASED THEREON

BACKGROUND OF THE INVENTION

1. Field of the Invention

The invention generally relates to optical disc recording or reading systems and, more particularly, to a method of and a system for modulating a series of 8-bit data into a 15-bit code stream that includes no merging bit for digital data recording on an optical disc and to a demodulation method and system adapted for the modulation method and system.

2. Description of the Prior Art

Generally speaking, in digital data recording or transmission, each byte of recorded digital data is modulated into a code such that the characteristics of an actually recorded code sequence (or recorded signal) matches those of the recording medium or the transmission channel, respectively, which is well known as the "channel coding". In case of magneto-optic recording, the modulation or channel coding is such that the recorded signal satisfies the following constraints: a minimum zero-run-length constraint (i.e., a minimum pit or land length constraint) due to optical transmission characteristics in recording and reading and to physical restrictions involved in pit formation, a maximum zero-run-length constraint (i.e., a maximum pit or land length constraint) for the facilitation of timing recovery, and a constraint on low-frequency components for the sake of servo control. The first two constraints are expressed en bloc as the (d,k) or run-length-limited (RLL) constraints, where the run of "0" symbols between consecutive "1" symbols in a recorded signal has length at least d and no more than k. The last constraint is judged by the digital sum value (DSV) as well known in the art.

Widely used RLL constraints are the (2,10) constraints, where 0-runs in the code have length at least 2 zeros and no more than 10 zeros, i.e., 0-runs have length at least 3T (T is a channel bit period) and no more than 11T. Actually used modulation schemes according to constraints (d,k)=(2,10) are, for example, eight-to-fifteen modulation (EFM) for the Compact Disc (CD) and EFMPlus (eight-to-sixteen modulation) for the Digital Versatile Disc (DVD).

Variety of other modulation schemes according to RLL constraints have been proposed so far. Some of them are as follows.

(1) Brian H. Marcus, Paul H. Siegel and Jack K. Wolf, "Finite-State Modulation Codes for Data Storage," IEEE Journal on selected areas in communications, Vol. 10, No. 1, January. 1992, pp. provides a self-contained exposition of modulation code design methods based upon the "state splitting algorithm."

(2) Japanese unexamined patent publication No. 08031100 (1996) discloses "Method and Device for Modulating Signal and Signal Demodulation Device," in which 8-bit source words are modulated into a 16-bit code stream that includes no merging bit.

(3) Japanese unexamined patent publication No.08077717 (1996) discloses "Digital Modulation and Demodulation Method, Device therefor, Recording Medium, and its Production," in which 8-bit source words are modulated into a series of 15-bit blocks each of which comprises a 14-bit code and one "merging bit." In this modulation system, the code bit three bits before the merging bit and/or the code bit three bits after the merging bit is (or are) so adjusted as to satisfy the minimum run length constraint and minimize the DSV.

(4) Japanese unexamined patent publication No.08149013 (1996) discloses "Digital Modulating and Demodulating Method and Device for the Method," in which 8-bit source words are modulated into a series of 15-bit blocks each of which comprises a 14-bit code and one "merging bit". In this modulation system, one of the surplus codes (the codes not used) in EFM is used in place of a selected code, if possible, such that the DSV becomes minimum.

All of the above-cited documents are hereby incorporated by reference.

However, there still remains a room for improvement in the art. It is therefore an object of the invention to provide an eight-to-fifteen modulation code system (or table), and an eight-to-fifteen modulation method and system that uses the modulation code table and that provides a 15-bit code stream satisfying the (2,10) RLL constraints and the DSV constraint and including no merging bit. SUMMARY OF THE INVENTION According to a first aspect of the invention, there is provided a code table for use in converting each source code of a p-bit source code sequence into a q-bit (p<q) object code whose NRZI-converted version satisfies predetermined run-length-limited (RLL) constraints in a p-to-q modulator which simply concatenates the converted q-bit object codes into a q-bit object code sequence that still satisfies the run-length limited constraints. The code table comprises a column for storing $2^p$ possible p-bit source codes in order of magnitude and a plurality of columns (hereinafter referred to as "subtables"). Each subtable comprises a subtable ID for identifying the subtable and $2^p$ combinations of $2^p$ q-bit object codes and respective next subtable fields which combinations are associated in the row directions with respective source codes. Each of the next subtable fields contains a subtable ID of a subtable to be used in a modulation of a next source of the source code sequence so as to cause the source code sequence to satisfy the RLL constraints. Object codes are permitted to appear repeatedly in the $2^p$ q-bit object codes in each subtable such that combinations of appearances of each of the overlapping object codes and respective next subtable fields are unique in the subtable. The subtables include at least one group of a first subtable and at least one second subtable such that the first subtable can be used for at least one second subtable for source codes of the $2^p$ source codes that are in a predetermined range and that, for each of the source codes in the predetermined range, the number of "1" symbols of two corresponding object codes of the first subtable and each of the second subtable(s) is an odd number.

In one embodiment, p and q are 8 and 15, respectively the RLL constraints are such that the run lengths of an NRZI converted signal of an object code sequence are limited to 3T through 11T, where T is a channel bit period of each object code. Also, the source codes in the predetermined range are set to 0 through 38.

According to another aspect of the invention, a method of and a system for modulating a p-bit source code sequence into a q-bit (p<q) object code sequence that includes no merging bit and whose NRZI converted version satisfies predetermined run-length-limited constraints. It is assumed that the method and the system use the above-described code table. A first object code associated with a source code of the source code sequence is retrieved from a subtable identified by a next subtable field attached to the last modulated object code. A test is made to see if the subtable identified by the next subtable field is one of the second subtable(s) and the source code is in the predetermined range. In response to a pass in the test, a second object code associated with the source code of the source code sequence is retrieved from the first subtable in the same group as that of the second subtable. A first digital sum value (DSV) and a second DSV are calculated by using the first source code and the second source code, respectively. If the absolute value of the second DSV is smaller than that of the first DSV, then the second object code is included in the q-bit object code sequence. And if the test is unsuccessful or if the absolute of the second DSV is not smaller than that of the first DSV, then the first object code is included in the q-bit object code sequence.

According to further aspect of the invention, a method of and a system for demodulating a q-bit code sequence into a p-bit (p<q) code sequence is provided. It is assumed that the q-bit code sequence is obtained by reading an optical disc on which information is recorded according to the above-mentioned modulating method or system. In addition to the above-described code table, the method and the system use state calculating means, based on a value of a next q-bit code following a current q-bit code, for calculating at least one subtable from which the next q-bit code might be derived to provide a calculated subtable ID's and a possible state table for associating each of ending types determined by respective ranges of the 0-run length on the LSB (least significant bit) side (hereinafter, referred to as "LSB 0-run length") of the current q-bit codes with ID's of possible subtables permitted to the ending type. ID's of the permitted subtables are found based on the LSB 0-run length of the current q-bit code. The calculated subtable ID's are obtained from the abovementioned state calculating means. An ID common to the ID's of the permitted subtables and the calculated subtable ID's is found as a next subtable ID for the next q-bit code. If a plurality of such common ID's are found, any of the found ID's may be used. A subtable identified by a next subtable ID for the current q-bit code is searched for a combination of the current q-bit code and the next subtable ID for the next q-bit code. A p-bit code in a row in which the combination is located is output as a demodulated code.

According to still another aspect of the invention, a method of and a system for demodulating a q-bit code sequence into a p-bit (p<q) code sequence is provided. It is assumed that the q-bit code sequence is obtained by reading an optical disc on which information is recorded according to the above-mentioned modulating method or system. The method and the system use state calculating means, based on a value of a next q-bit code following a current q-bit code, for calculating at least one subtable from which the next q-bit code might be derived to provide a calculated subtable ID's and a decoding table for associating each of possible q-bit current codes with an ending type and corresponding p-bit codes further associated with respective subtable ID's for use in a demodulation of the next q-bit code. ID's of the permitted subtables are found based on the ending type associated with the q-bit current codes. The calculated subtable ID's are found from the above-mentioned state calculating means.

An ID common to the ID's of the permitted subtables and the calculated subtable ID's is found as a next subtable ID for the next q-bit code. If a plurality of such common ID's are found, any of the found ID's may be used. A p-bit code associated with the current q-bit code and the next subtable ID for the next q-bit code is obtained from the decoding table and output as a demodulated p-bit code.

In one embodiment, p and q are 8 and 15, respectively the RLL constraints are such that the run lengths of an NRZI converted signal of an object code sequence are limited to 3T through 11T, where T is a channel bit period of each object code.

BRIEF DESCRIPTION OF THE DRAWING

The features and advantages of the present invention will be apparent from the following description of an exemplary embodiment of the invention and the accompanying drawings, in which:

FIG. 3 is a finite-state transition diagram used for generating the codes for use in the modulation by the modulator 13;

FIG. 4A shows a part of an exemplary state-split code table which is obtained by the state selection and the state splitting in the FSTD of FIG. 3 and which comprises code words that end with state "0";

FIG. 4B is a diagram showing a way of reducing state-split code tables like FIG. 4A into a code table comprising 7 subtables;

Figure 5B:
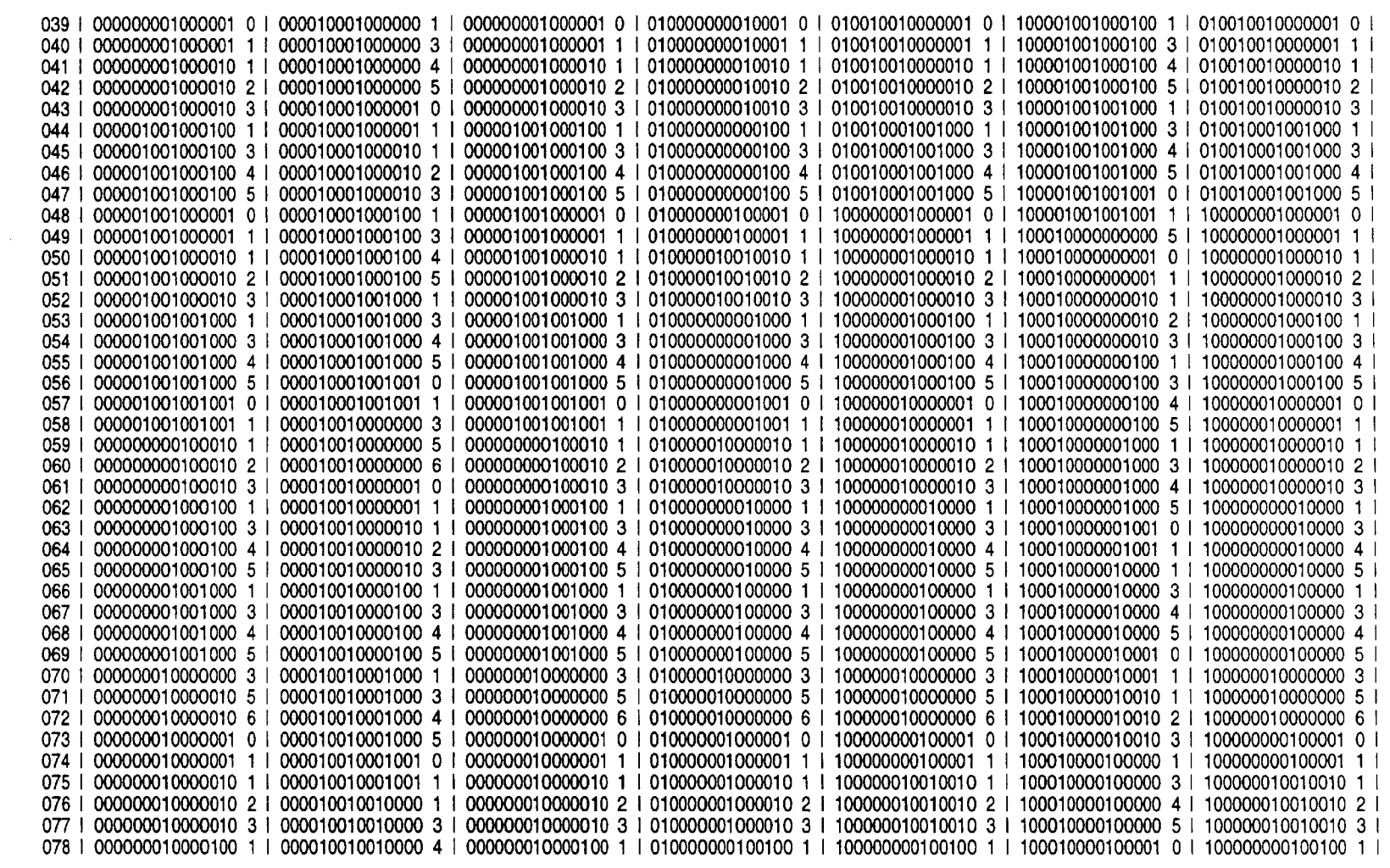
Figure 5C:
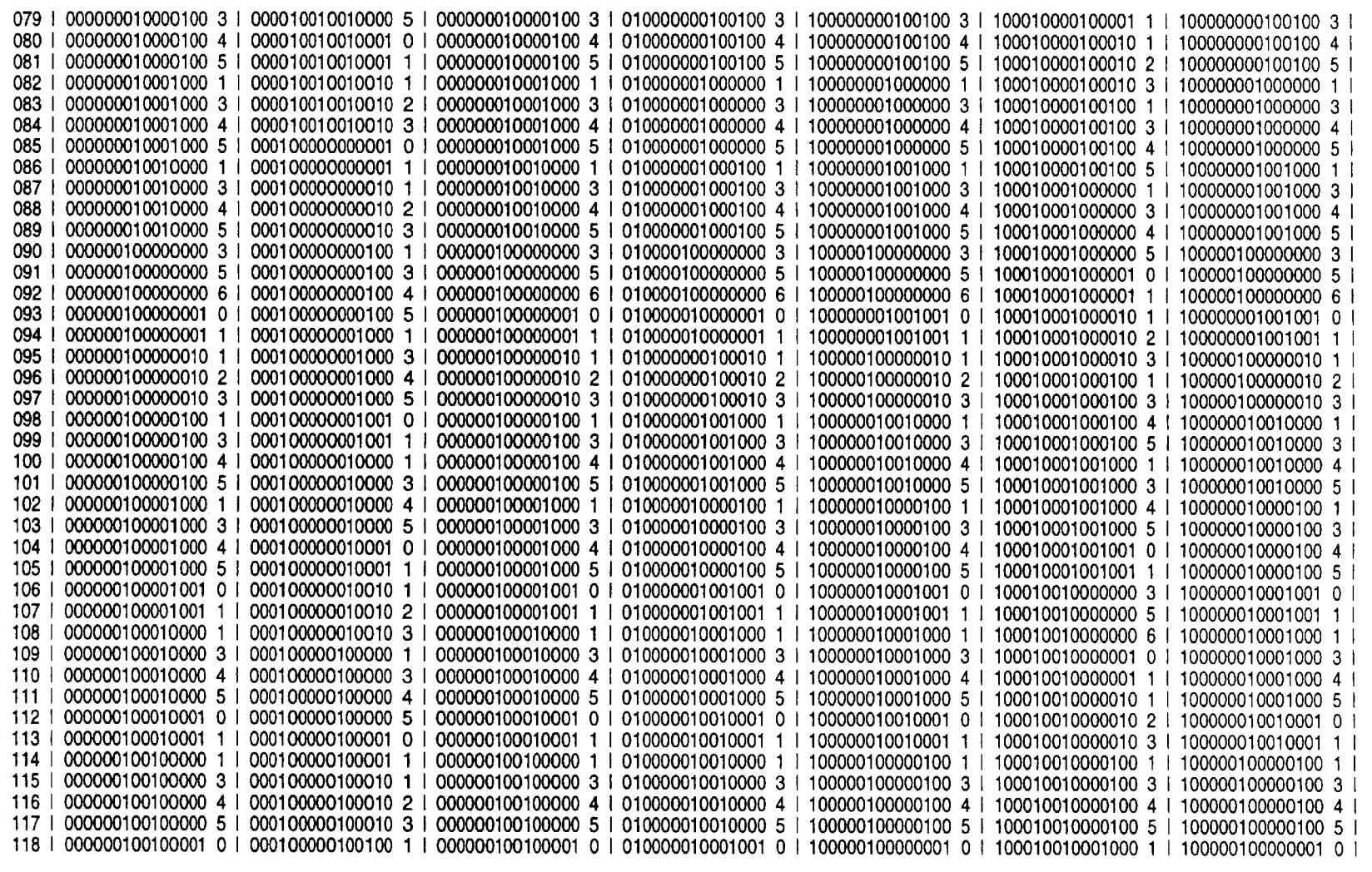
Figure 5D:
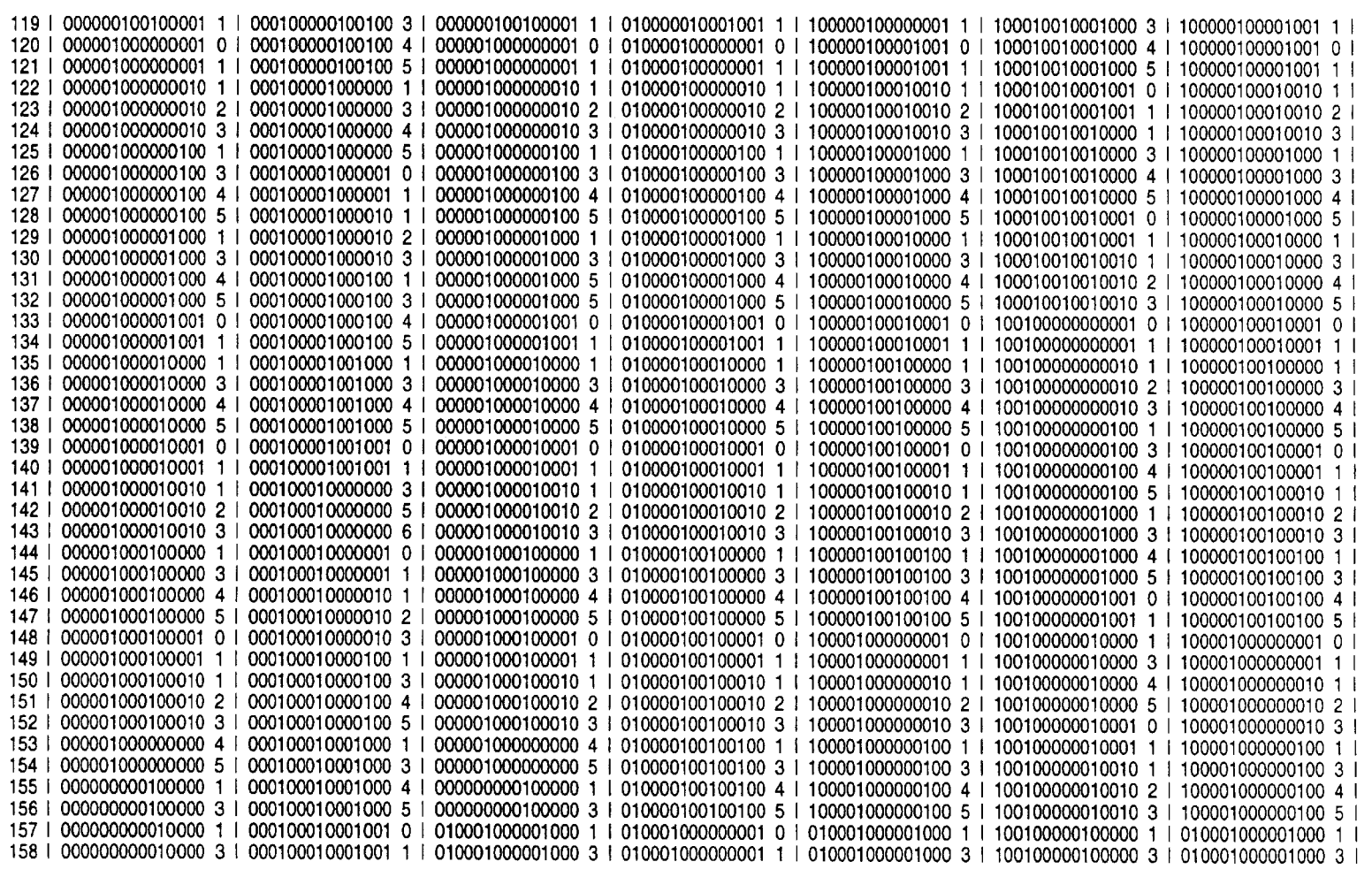
Figure 5E:
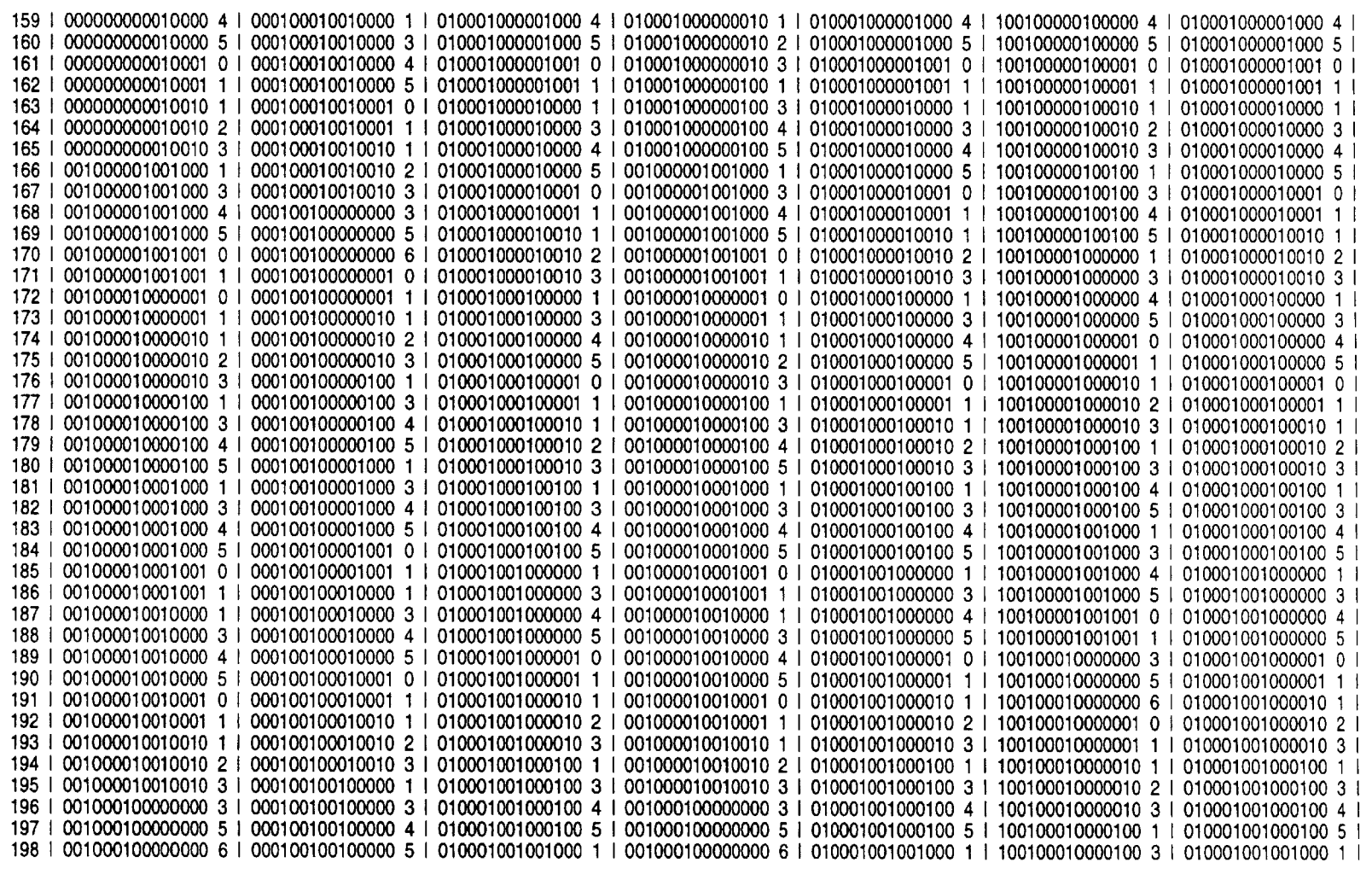
Figure 5F:
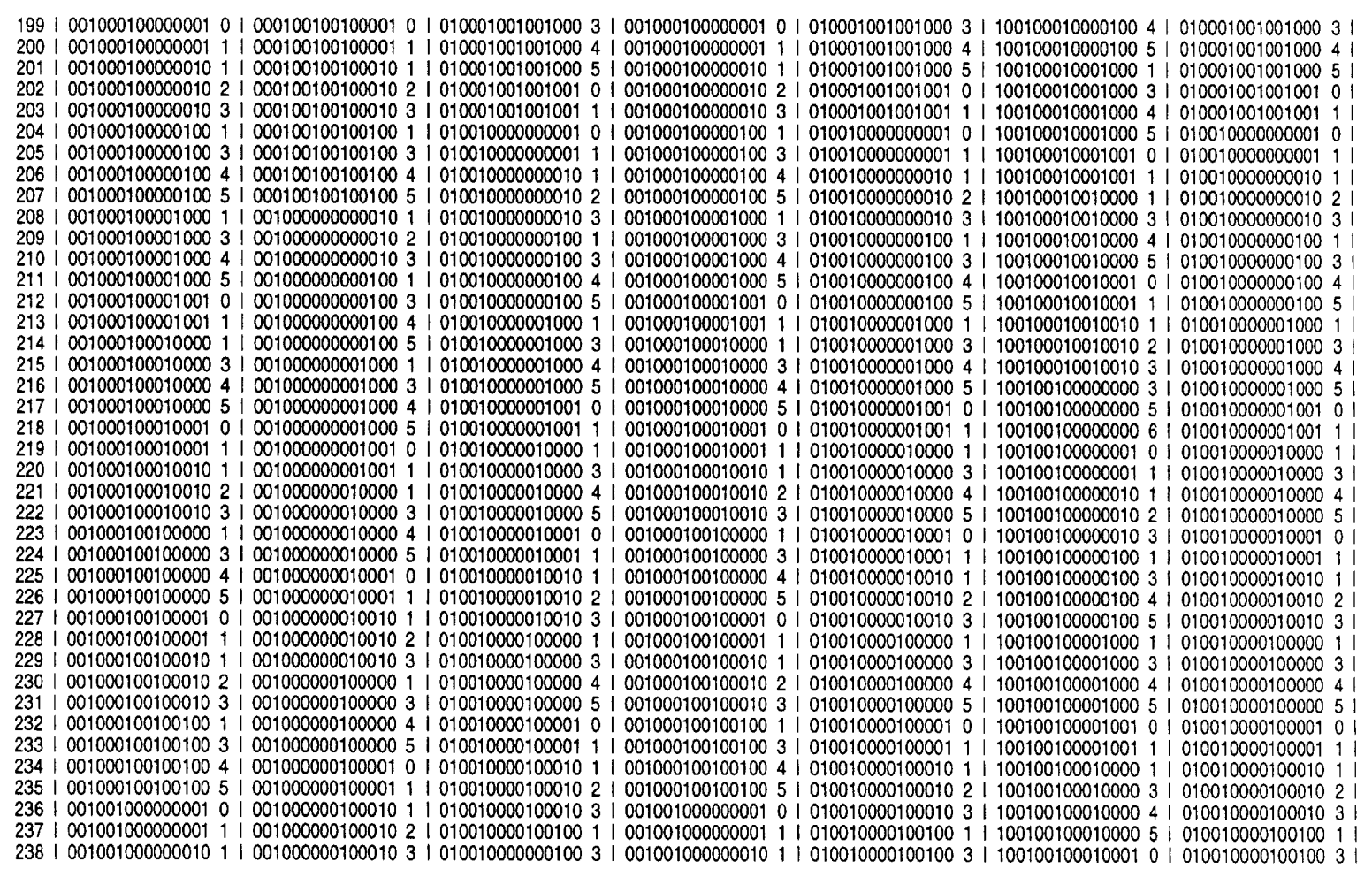

FIGS. 5A through 5G, when combined such that the first column becomes serial numbers from 0 to 255, shows a code table according to an illustrative embodiment of the invention;

FIG. 9 is a diagram showing a table for associating each of the conditional expression groups with a corresponding next state code;

FIG. 10 is a diagram visualizing truth values of the conditional expression groups of the table of FIG. 9;

FIG. 14 is a diagram showing a part of a code table for use in the 15-to-8 demodulator 33a of FIG. 10.

Throughout the drawing, the same elements when shown in more than one figure are designated by the same reference numerals.

DETAILED DESCRIPTION OF THE PREFERRED EMBODIMENTS

Figure 1:
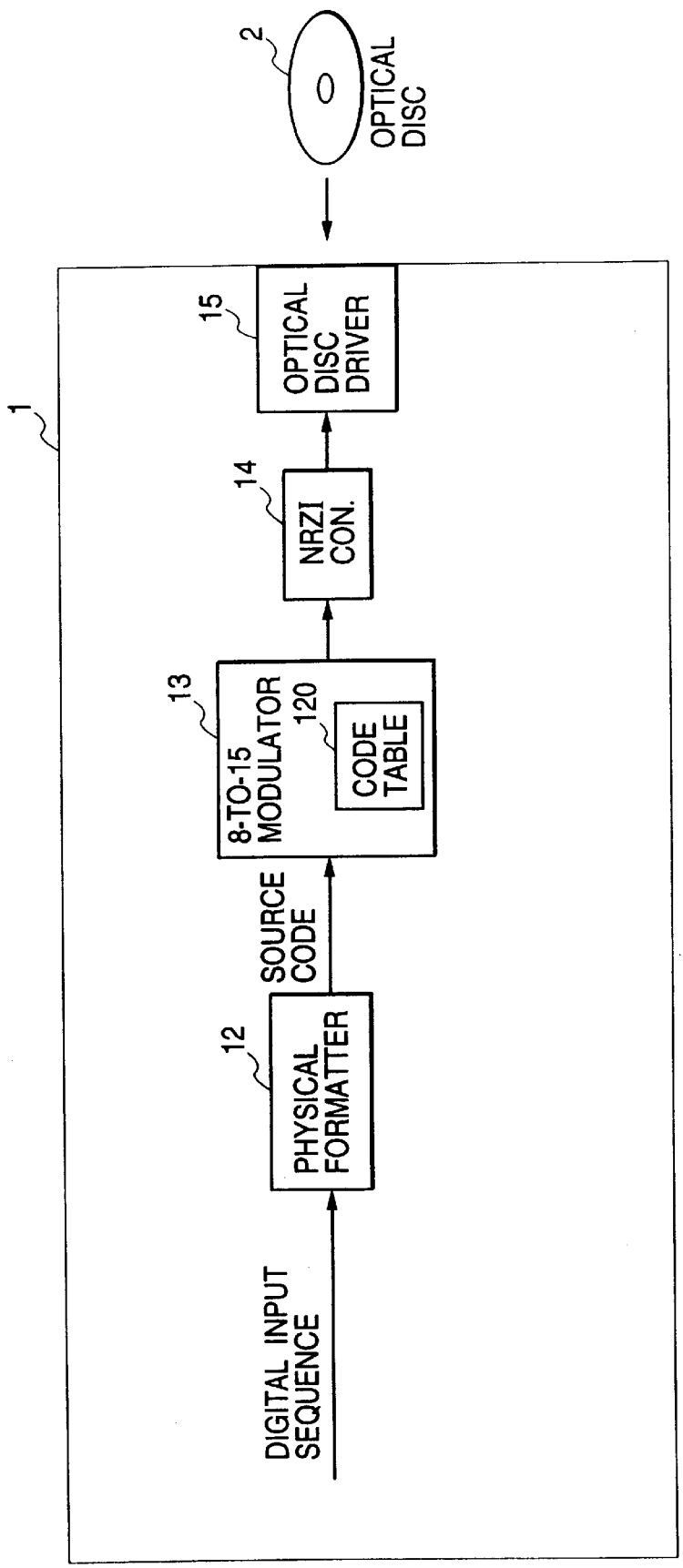
FIG. 1 is a schematic block diagram showing an exemplary device 1 that includes an optical disc recording system (11 through 14) provided with an 8-to-15 modulator 13 according to the principles of the invention.

FIG. 1 is a schematic block diagram showing an exemplary device 1 that includes an optical disc recording system (12 through 15) provided with an 8-to-15 modulator 13 according to the principles of the invention. The device 1 of FIG. 1 may be any device that can record multimedia information on an optical disc 2 by using the inventive 8-to-15 modulator 13. The device 1 includes a physical formatter 12, the 8-to-15 modulator 13, an NRZI converter 14 and an optical disc driver 15. The modulator 13 includes a code table 120 according to the principles of the invention. The code table 120 will be detailed later.

In optical disc recording operation, information to be recorded is obtained as a digital input sequence within the device or from the outside through an appropriate interface (not shown). The information may be video and/or audio information. The digital input sequence is supplied to the physical formatter 12. The physical formatter 12 formats the input sequence into a form suited for recording on the optical disc 2 by adding ECC (error correcting codes) and sync signals to the input sequence. The output from the formatter 12 is supplied as 8-bit source codes to the 8-to-15 modulator 13. The modulator 13 modulates the 8-bit source codes into 15-bit output codes in a manner as described in great detail later. The 15-bit output codes are NRZI converted into an NRZI signal. The optical disc driver 15 records the NRZI signal on the optical disc 2.

Figure 2:
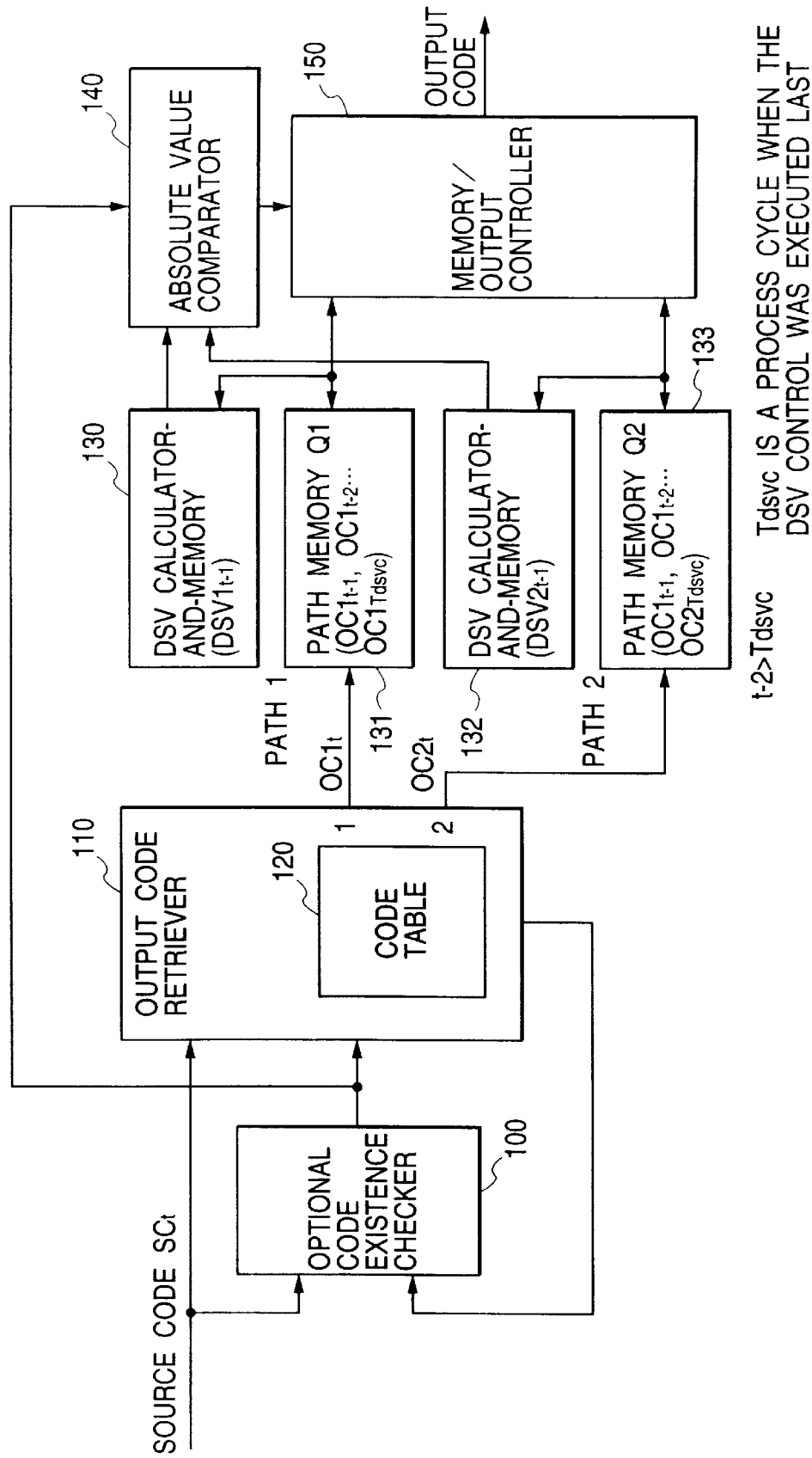
FIG. 2 is a schematic block diagram showing an arrangement of the 8-to-15 modulator 13 of FIG. 1.

FIG. 2 is a schematic block diagram showing an arrangement of the 8-to-15 modulator 13 of FIG. 1. The inventive modulator 13 of FIG. 2 is provided with a code table 120. We first discuss the code table 120 in the following. Code Table FIG. 3 is a diagram showing a finite-state transition diagram of a finite-state encoder (not shown) used for generating the codes for use in the modulation by the modulator 13. In FIG. 3, the numerals 1 through 10 in circles denote the possible states permitted to the modulator 13. Each of the numerals indicates the number of 0's the finite-state encoder has output till the finite-state encoder reaches the state after the finite-state encoder has output "1" last. For example, a state numbered "0" is the state in which the finite-state encoder has just output "1". The directed edges indicate the possible transitions between the possible finite states. Each of the edges is labeled "0" or "1", which is the symbol the finite-state encoder outputs when the state of the finite-state encoder changes along the edge. The zero-run length is limited to 2 to 10 "0" symbols, which we call "run-length-limited (RLL) (2,10) constraints". The finite-state transition diagram of FIG. 3 satisfies RLL (2,10) constraints. Thus, in any code, "1" symbols never appear in succession but appears at an interval of 2 through 10 "0" symbols. The set of all sequences satisfying these constraints is conveniently described by reading the labels off of paths through the finite-state transition diagram.

An adjacency matrix A=[$a_{i,j}$] is obtained from the finite-state transition diagram FSTD) of FIG. 3 as shown follows.

$$A = \begin{bmatrix} 0 & 1 & 0 & 0 & 0 & 0 & 0 & 0 & 0 & 0 \\ 0 & 0 & 1 & 0 & 0 & 0 & 0 & 0 & 0 & 0 \\ 1 & 0 & 0 & 1 & 0 & 0 & 0 & 0 & 0 & 0 \\ 1 & 0 & 0 & 0 & 1 & 0 & 0 & 0 & 0 & 0 \\ 1 & 0 & 0 & 0 & 0 & 1 & 0 & 0 & 0 & 0 \\ 1 & 0 & 0 & 0 & 0 & 0 & 1 & 0 & 0 & 0 \\ 1 & 0 & 0 & 0 & 0 & 0 & 0 & 1 & 0 & 0 \\ 1 & 0 & 0 & 0 & 0 & 0 & 0 & 0 & 1 & 0 \\ 1 & 0 & 0 & 0 & 0 & 0 & 0 & 0 & 0 & 1 \\ 1 & 0 & 0 & 0 & 0 & 0 & 0 & 0 & 0 & 0 \end{bmatrix} \quad (1)$$

The element $a_{i,j}$ of the adjacency matrix A equals the number of edges that starts from the state i to and ends in the state j. For example, since there is an edge from state "0" to state "1", $a_{0,1}=1$. Since there is no edge from state "0" to state "2", $a_{0,2}=0$.

As is well known in the art (see document (1)), the maximum code rate or the Shannon capacity is given by:

$$\log_2 \lambda(A),$$

where $\lambda(A)$ is the largest real eigenvalue of the matrix A. Since $\lambda(A)$ is 1.4558, the maximum code rate is $\log_2 (1.4558) \approx 0.54478$. This means that an encoder with a coding rate smaller than 0.54478 is possible.

If p equals 8 in a p-to-q encoder, then it is seen that the maximum possible value of q is 15 because the code rate of the p-to-q encoder is 8/15=0.533 . . . , which is smaller than the calculated maximum code rate 0.54478. Therefore, if an 8-to-q encoder is to be constructed according to the RLL (2,10) constraints, the object code length q can be set to 15 but not to less than 15.

In order to examine the 15-bit codes or the paths consisting of 15 edges in the diagram of FIG. 3, we obtain the fifteenth power of the adjacency matrix A as follows.

$$A^{15} = \begin{bmatrix} 57 & 40 & 27 & 18 & 13 & 9 & 6 & 4 & 3 & 2 & 1 \\ 083 & 57 & 40 & 27 & 18 & 13 & 9 & 6 & 4 & 3 & 2 \\ 122 & 83 & 57 & 40 & 27 & 18 & 13 & 9 & 6 & 4 & 3 \\ 120 & 82 & 56 & 39 & 27 & 18 & 12 & 9 & 6 & 4 & 3 \\ 117 & 80 & 55 & 38 & 26 & 18 & 12 & 8 & 6 & 4 & 3 \\ 113 & 77 & 53 & 37 & 25 & 17 & 12 & 8 & 5 & 4 & 3 \\ 107 & 73 & 50 & 35 & 24 & 16 & 11 & 8 & 5 & 3 & 3 \\ 98 & 67 & 46 & 32 & 22 & 15 & 10 & 7 & 5 & 3 & 2 \\ 85 & 58 & 40 & 28 & 19 & 13 & 9 & 6 & 4 & 3 & 2 \\ 67 & 45 & 31 & 22 & 15 & 10 & 7 & 5 & 3 & 2 & 2 \\ 40 & 27 & 18 & 13 & 9 & 6 & 4 & 3 & 2 & 1 & 1 \end{bmatrix} \quad (2)$$

The adjacency matrix $A^{15}$ (=[$a'_{i,j}$]) is obtained from the finite-state transition diagram (not shown) for the fifteenth power of FSTD of FIG. 3. In the finite-state transition diagram (not shown) for the fifteenth power of FSTD of FIG. 3, each edge is labeled with a 15-bit sequence or code. Again, in the adjacency matrix $A^{15}$, each element $a'_{i,j}$ is obtained by counting the number of edges that start from state i and end in state j in the fifteenth-powered FSTD. For this reason, the sum of the elements in each row i, i.e., $$RS_i = \sum_{j=0}^{10} a_{ij}$$

(hereinafter, referred to as a "row sum") indicates the number of edges that start from state i, i.e., the number of codes definable in state i. In order to be able to define 15-bit object codes for more than 256 ($=2^8$) 8-bit source code at each of the possible states, each row sum $RS_i$ have to be equal to or larger than 256. The row sums of the matrix $A^{15}$ are shown in the following table 1.

TABLE 1

| state "i" | row sum $RS_i$ | |
|---|---|---|
| 0 | 180 | <256 |
| 1 | 262 | |
| 2 | 382 | |
| 3 | 376 | |
| 4 | 367 | |
| 5 | 354 | |
| 6 | 335 | |
| 7 | 307 | |
| 8 | 267 | |
| 9 | 209 | <256 |
| 10 | 124 | <256 |

As seen from Table 1, definable codes are lacking at stares "0", "9" and "10". For this reason, the code table 120 is generated by using a technique well known as the state splitting algorithm (see document (1)).

The states "0", "1", "6", "8", "9" and "10" are first selected in FSTD of FIG. 3, which is achieved by restructuring the matrix $A^{15}$ into the following 6×6 matrix T.

$$T = \begin{bmatrix} 57 & 40 & 73 & 7 & 2 & 1 \\ 83 & 57 & 107 & 10 & 3 & 2 \\ 107 & 73 & 136 & 13 & 3 & 3 \\ 85 & 58 & 109 & 10 & 3 & 2 \\ 67 & 45 & 85 & 8 & 2 & 2 \\ 40 & 27 & 50 & 5 & 1 & 1 \end{bmatrix} \quad (3)$$

Assume that $V=(v_k)$ (k=1,2 . . . , 6) is a column vector and that each of the possible state Nos. 1 through 6 (which correspond to the states "0", "1", "6", "8", "9" and "10" of the fifteenth powered FSTD) of FSTD expressed by the matrix T is split into $v_k$ states. Then, if the inequality $$TV \geq 256V \quad (4)$$

is satisfied, a code table can be created. If the column vector V is set as $$\begin{pmatrix} 2 \\ 3 \\ 4 \\ 3 \\ 2 \\ 1 \end{pmatrix} \quad (5)$$

then, the inequality (4) is expressed as shown in the following Table 2.

TABLE 2

| state No. (k) | state (0-run length) | TV | 256 V |
|---|---|---|---|
| 1 | 0 | 552 | 512 |
| 2 | 1 | 803 | 768 |
| 3 | 6 | 1025 | 1024 |
| 4 | 8 | 818 | 768 |
| 5 | 9 | 639 | 512 |
| 6 | 10 | 379 | 256 |

As seen from Table 2, the vector (5) satisfies the inequality (4), which means that splitting the states "0", "1", "6", "8", "9" and "10" into 2,3,4,3,2 and 1 states, respectively in FSTD (not shown) expressed by the matrix T enables the creation of a code table from the split FSTD (not shown). For example, the two states into which the state "0" is split are named like "01" and "02". Also, in this case, in order to ensure correct decoding, it is necessary to avoid assigning the same object code to the states "01" and "02". In this way, the 6 states of FSTD by the matrix T is split into 15 states as shown in Table 3.

TABLE 3

| state | → | split states |
|---|---|---|
| "0" | → | 01, 02 |
| "1" | → | 11, 12, 13 |
| "6" | → | 61, 62, 63, 64 |
| "8" | → | 81, 82, 83 |
| "9" | → | 91, 92 |
| "10" | → | 10 |

The above-mentioned state selection and state splitting in the FSTD of FIG. 3 yields a group of state-split code tables of respective ending types. Specifically, the code words of the first code table of the group end with state "0" (i.e., the LSB of the code words are "1"). Similarly, the code words of the second through sixth state-split code tables (not shown) end with states "1", "6", "8", "9" and "10", respectively in this specific example. FIG. 4A shows a part of an exemplary state-split code table of code words that end with state "0". The code table of FIG. 4A comprises, for each of the 15 split states, a list or subtable of code words expressed in the decimal system.

However, the state-split code table of FIG. 4A includes such many subtables as to make the operation complicated. For this reason, each state-split code table is so created that subtables (or split states) 02, 12 and 62 of the state-split code table share the same code words for most possible input codes, i.e., most codes are common to subtables 02, 12 and 62 and only a part of the subtables are different from one another. (Since FIG. 4A shows only a first portion of state-split code table, subtables 02, 12 and 62 look like identical in FIG. 4A.), Similarly, each state-split code table is so created that each of subtable groups (13, 61, 81), (63, 91), and (64, 83, 92, 10) share the same code words for most possible input codes as guessed from FIG. 4A. This enables a reduction of subtables in a manner shown in FIG. 4B.

According to the present invention, the number of states, i.e. the number of subtables is reduced such that though each of the reduced subtables includes some of the codes repeatedly, the subtable has, for 256 8-bit source (or input) codes, respective object (or output) codes so as to enable the demodulation. This is achieved by integrating each of the above-mentioned subtable groups into a single subtable of code words common to each subtable group and renaming the integrated subtables and the remaining subtables 01, 11 and 82 as shown in FIG. 4B.

In this way, the state-split code tables are reduced into a code table comprising 7 subtables in this specific example. Doing this enables a decoding operation in which each of the input codes having been modulated (or encoded) through an inventive code table is decoded based on the input code and the next input code. It is noted that the code table of FIG. 4A can be reduced into a further smaller code table comprising less than 7 subtables. However, a code table of less than 7 subtables causes the decoding operation to become complicated. This is because a decoding of each of the input codes having been modulated through such a code table requires not only the input code and the next input code but also one or more input codes following the next input code.

Then, assigning a possible input code to each of the code words of each of the 7 subtables of the reduced code table, we obtain an inventive code table as shown in FIGS. 5A through 5G, which are to be combined such that the first column becomes serial numbers from 000 to 255. In this case, the assignment of 256 possible input codes is achieved such that the same input code is assigned to the same code words that cause a transition to an identical new state (or that accompany the same next state code (described below)) and such that the DSV control is possible in the manner detailed later.

In FIG. 5, the source code in the first column or field is expressed in the decimal system. Each record of each of the subtables comprises a 15-bit binary object code and a single-digit next subtable (or next state) code corresponding to a source code in the row where the record is positioned. The next subtable code is a numeral (from 0 to 6) indicative of the number of the subtable to be used in order to satisfy the RLL constraints even when the code is concatenated to the preceding code.

In the code table of FIG. 5, the object codes are classified into 4 ending types according to the 0-run length on the LSB side. When an object code is output from the modulator 13, the internal state of the modulator 13 changes into one of the states (so to speak, "next states") assigned to the ending type of the output object code. In the embodiment of FIG. 5, the relationship among the LSB 0-run length, the ending type, and the possible next states is shown in the following table.

TABLE 4

| ending type | LSB 0-run length | possible next states (subtables used for the next code) |
|---|---|---|
| 0 | 0 | 0, 1 |
| 1 | 1 | 1, 2, 3 |
| 2 | 2 to 6 | 1, 3, 4, 5 |
| 3 | 7 to 10 | 3, 4, 5, 6 |

Referring to subtable 0 in FIG. 5, an identical object code "000000000100000" for example is used for two different source codes "0" and "1" as shown like below:

| For source code: | Object code | Next state (or subtable) |
|---|---|---|
| 0 | 000000000100000 | 4 |
| 1 | 000000000100000 | 5 |
| 2 | 000000000100001 | 0 |
| 3 | 000000000100001 | 1 |

As seen from above, each object code is used for some different states. However, in demodulation operation, which of the source codes the object code (the code read from the optical disc 2 in this case) corresponds to is determined by the next state. In other words, the source code can be identified in demodulation, because for any object code, only one source code is assigned to the next state, i.e., there is no such source code as is shared by different next states.
Subtables 0 and 3:

Subtable 0 is used when the 0-run length in the LSB (least significant bit) side of the preceding code word is zero, i.e., when the preceding code word ends with "1". In subtable 3, object codes for the source codes "000" through "038" are arranged to have an MSB 0-run length of 2 or to begin with "001". For this reason, even replacing an object code of subtable 0 which corresponds to one of the source codes "000" through "038" with a corresponding object code of subtable 3 still satisfies the RLL (2,10) constraints. In other words, subtable 0 can be replaced with subtable 3 for the source codes "000" through "038". (For this reason, when subtable 0 is to be used for any of the source codes "000" through "038", it can be that there is an optional code.) Also, the above-mentioned replacement causes no problem in a demodulation of a code one word before.
Subtables 2 and 4

Subtable 2 is used when the 0-run length in the LSB (least significant bit) side of the preceding code word is one, i.e., when the preceding code word ends with "10". In subtable 4, object codes for the source codes "000" through "011" and "026" through "047" are arranged to have an MSB 0-run length of 1 or to begin with "01". Therefore, subtable 2 can be replaced with subtable 4 for the source codes "000" through "011" and "026" through "047". It is noted that in order to prevent the demodulation from become impossible, it is prohibited to replace subtable 2 with subtable 4 for the source codes "012" through "025".
Subtables for Previous Code of Type 2 and Subtable 0

An object code with a next state code "3" in subtables used when the previous object code was of type 2 (i.e., subtables 1, 3, 4 and 5) can be replaced with a corresponding object code of subtable 0 if the replacement of the former code with the latter code ensures the satisfaction of the RLL (2,10) constraints.

It should be noted that object codes of subtables 0 and 3 associated with each of the source codes "000" through "038" are different from each other in the odd/even property of the number of "1" symbols the object codes. In other words, the subtables 0 and 3 are so arranged that the number of "1" symbols of two corresponding object codes of the subtables 0 and 3 is an odd number for the source codes "000" through "038". Also, object codes of subtables 2 and 4 associated with each of the source codes "000" through "011" and "026" through "047" are different from each other in the odd/even property of the number of "1" symbols in the object codes. Further, it is noted that the object codes are so assigned that the most possible object codes with a next state code "3" in subtables 1, 3, 4 and 5 are different from corresponding object codes of subtable 0 in the odd/even property of the number of "1" symbols in the object codes. Therefore, the DSV of the modulated code sequence can be controlled to become small by selecting an appropriate object code if any optional object code exists as in the above-mentioned three cases.
Eight-to-fifteen Modulator Turning now to FIG. 2, the 8-to 15 modulator 13 comprises an optional code existence checker 100, an output code retriever 110 for retrieving an object code according to the output from the optional code existence checker 100, a first pair of a DSV calculator-and-memory (DSV1) 130 and path memory (Q1) 131 having its input connected to a first output terminal of the code retriever 110, a second pair of a DSV calculator-and-memory (DSV2) 132 and path memory (Q2) 133 having its input connected to a second output terminal of the code retriever 110, an absolute value comparator 140 for comparing the values DSV1 and DSV2 of the two DSV calculator-and-memories in response to the optional code existence checker 100 output, and a memory/output controller 150 for outputting the contents (or digital output code sequence) of a relevant path memory Q1 or Q2 according to the absolute value comparator 140 output.

In FIG. 2, the source or input code for the current modulation cycle t is denoted by "SCt"; the object code for the current input code SCt is denoted by "OC1t"; and an alternative (or optional) object code for SCt, if any, is denoted by "OC2t". Usually (except for a short period from the DSV value updating till the end of the modulation cycle), the values DSV1 and DSV2 of the DSV memories 130 and 132 are equal to the DSV values calculated for the object codes till the last modulation cycle, i.e., $DSV1_{t-1}$ and $DSV2_{t-1}$, respectively.

The path memories 131 and 133 stores output queues Q1 and Q2, respectively. The queue Q1 contains the object codes from the modulation cycle (Tdsvc) when the DSV control was last executed to the last modulation cycle t−1. That is, $$Q1 = OC1_{t-1}, OC1_{t-2}, \ldots, OC1_{Tdsvc}.$$

The queue Q1 contains an alternative object code when the DSV control was last executed and the object codes for the modulation cycles from Tdsvc to t−1. That is, $$Q2 = OC1_{t-1}, OC1_{t-2}, \ldots, OC2_{Tdsvc}.$$

If an optional object code exists or a DSV control is to be carried out in a modulation cycle t, the memory/output controller 150 outputs the contents of the path memory (Q1 or Q2) of the path in which the absolute value of the DSV memory contents is smaller.

Though we have shown, in FIG. 2, an example of hardware implementation of the 8-to-15 modulator 13 of FIG. 1, the 8-to-15 modulator 13 may be embodied by software.

Figure 6:
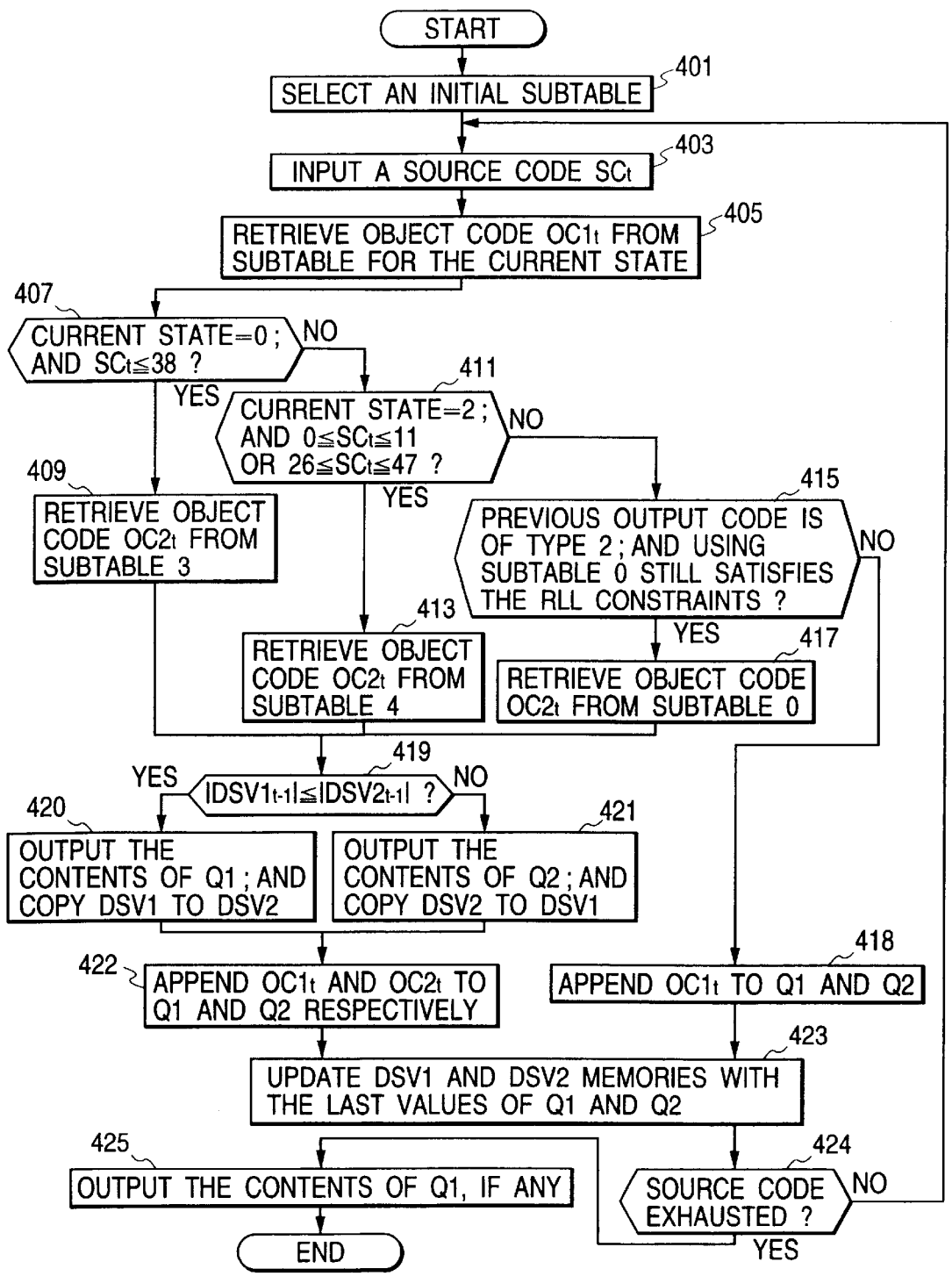
FIG. 6 is a flowchart showing an modulation operation performed by a not-shown CPU in the modulator 13 in accordance with the principles of the invention.

FIG. 6 is a flowchart showing an modulation operation performed by a not-shown CPU in the modulator 13 in accordance with the principles of the invention. Referring to FIGS. 2 and 6, the operation of the modulator 13 is described in the following.

As one of initial setting procedures, an initial subtable (subtable 0 in a preferred embodiment) is first selected before accepting a source code sequence in step 401. Then, a source code SCt is input in step 403. In FIG. 2 (in case of hardware implementation), the source code SCt is supplied to the optional code existence checker 100 and the object code retriever 110. An object code $OC1_t$ corresponding to the source code SCt is retrieved from the subtable for the current state in step 405. The subtable for the current state is determined by the previous object code, and is assumed to be subtable 0 for the first code of an input code sequence. The object code retriever 110 performs step 405.

In steps 407, 411 and 415, tests are made for the above-mentioned three replacement cases to see if, in addition to the object code of the current state subtable, there is any optional object code of a subtable other then the current state subtable, as detailed later. These tests are made in the optional code existence checker 100 in case of hardware implementation as shown in FIG. 2.

If all of the test results are NO meaning that there is no optional code, then the retrieved object code OC1 is appended to the ends of the queues Q1 and Q2 of the path memory 131 in step 418. The values of the DSV memories DSV1 and DSV2 are updated with the last values of the queues Q1 and Q2 in step 423. Then, a test is made to see if the input code sequence has been exhausted in step 424. If so, then the content of Q1, if any, is output in step 425, and the operation is terminated. Otherwise, the control is returned to step 403.

The above-mentioned optional code existence tests are detailed here. Following step 405, a test is made in step 407 to see if the current state is "0" and the input source code SCt is not larger than 38. If so, then a second object code $OC2_t$ corresponding to the source code SCt is retrieved from the subtable 3 in step 409 (or by the object code retriever 110).

Otherwise, another test is made in step 411 to see if the current state is "2" and the source code SCt satisfies that $0 \leq SCt \leq 11$ or $26 \leq SCt \leq 47$. If so, then a second object code $OC2_t$ corresponding to the source code SCt is retrieved from the subtable 4 in step 413 (or by the object code retriever 110).

Otherwise, a further test is made in step 415 to see if the previous output code is of type 2 and using subtable 0 still satisfies the RLL (2,10) constraints. If so, then a second object code $OC2_t$ corresponding to the source code SCt is retrieved from the subtable 0 in step 417 (or by the object code retriever 110).

After step 409, 413 or 417, the control is passed to step 419, where a test is made (in the absolute value comparator 140 in case of hardware implementation) to see if the absolute value of $DSV1_{t-1}$ (the digital sum value stored in the DSV1 memory 130) is not larger than that of $DSV2_{t-1}$ (the digital sum value stored in the DSV2 memory 132). If so, the control is passed to step 420, where the object code sequence in the queue Q1, i.e., $OC1_{t-1}, OC1_{t-2}, \ldots, OC1_{Tdsvc}$ is output as a part of the output code sequence from the 8-to-15 modulator 13; and the DSV1 memory 130 contents or $DSV1_{t-1}$ is copied to the DSV2 memory 132 (These operations are executed by the memory/output controller 150 in case of hardware implementation).

If the absolute value of $DSV1_{t-1}$ is larger than that of $DSV2_{t-1}$ in step 419, then the control is passed to step 421, where the object code sequence in the queue Q2, i.e., $OC1_{t-1}, OC1_{t-2}, \ldots, OC2_{Tdsvc}$ is output as a part of the output code sequence; and the DSV2 memory 132 contents or $DSV2_{t-1}$ is copied to the DSV1 memory 130 (These operations are executed by the memory/output controller 150 in case of hardware implementation).

Following step 420 or 421, the control is passed to step 422, where the retrieved codes $OC1_t$ and $OC2_t$ are appended to the output code queues Q1 and Q2, respectively. Then, the control is passed to the above-described step 423 and accordingly the description of the subsequent operation is omitted here.

In this way, the 8-to-15 modulator modulates an input 8-bit code sequence into a 15-bit code sequence suited for NRZ1 recording on the optical disc.

Figure 7:
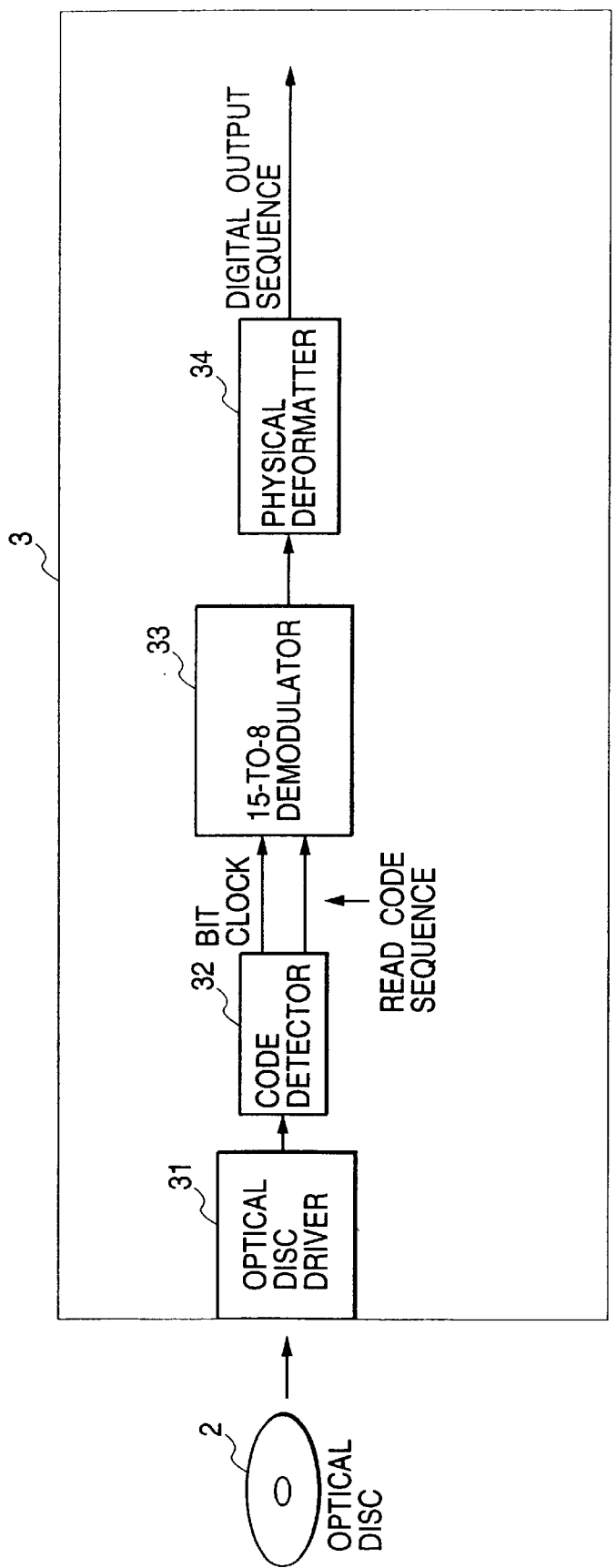
FIG. 7 is a schematic block diagram showing an exemplary device 3 that includes an optical disc playing system (31 through 34) provided with an 15-to-8 demodulator 32 according to the principles of the invention

FIG. 7 is a schematic block diagram showing an exemplary device 3 that includes an optical disc playing system (31 through 34) provided with an 15-to-8 demodulator 33 according to the principles of the invention. The device 3 of FIG. 7 may be any device that includes the inventive 15-to-8 demodulator 33 to reproduce multimedia information that is recorded on an optical disc 2 by using the device 1 of FIG. 1. The device 3 includes an optical disc driver 31, a code detector 32, the 15-to-8 demodulator 33 and a physical deformatter 34.

In optical disc playing operation, the optical disc driver 31 reads a recorded signal on the optical disc 2. The code detector 32 detects a code sequence and a bit clock from the read signal. Using the bit clock, the 15-to-8 demodulator 33 recovers 15-bit codes from the code sequence and demodulates the 15-bit codes into an 8-bit code sequence by using the code table 120. The physical deformatter 34 removes ECC and sync signals from the 8-bit code sequence to provide a digital output sequence.

Figure 8:
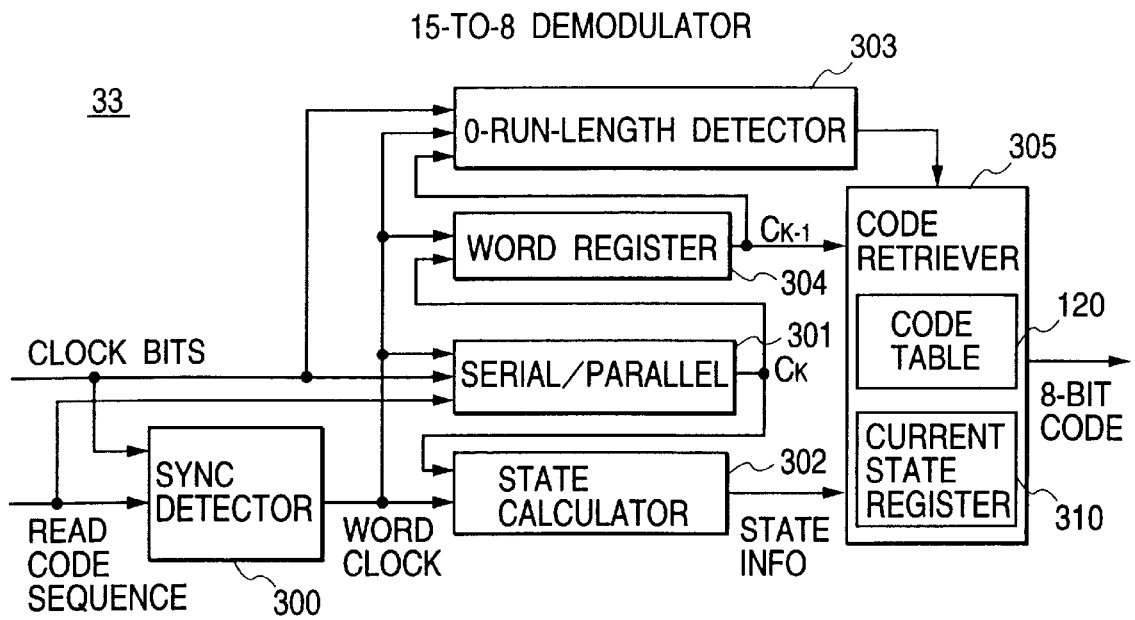
FIG. 8 is a schematic block diagram showing an arrangement of the 15-to-8 demodulator 33 of FIG. 7.

FIG. 8 is a schematic block diagram showing an arrangement of the 15-to-8 demodulator 33 of FIG. 7. The demodulator 33 comprises a sync detector 300, a serial/parallel converter 301, a state calculator 302, a 0-run length detector 303, a word register 303, and a code retriever 305. The code retriever 305 includes the above-described code table 120.

The read code sequence from the code detector 32 is supplied to the sync detector 300 and the serial/parallel converter 301. The bit clock from the code detector 32 is supplied to the sync detector 300, the serial/parallel converter 301 and the 0-run length detector 303. The sync detector 300 generates a word clock, which is used for recovering 15-bit codes from the read code sequence. The word clock is supplied to the serial/parallel converter 301, the state calculator 302 and the 0-run length detector 303.

Using the word clock, the serial/parallel converter 301 converts each code of the read code sequence into a 15-bit code $C_k$, which is supplied to the state calculator 302 and the word register 304. The word register 304 delays the received 15-bit code $C_k$ by one word (15 bits) on the basis of the word clock and supplies the one-word-delayed code $C_{k-1}$ to the code retriever 305. The one-word-delayed code $C_{k-1}$ is a code to be demodulated in the current demodulation cycle and accordingly referred to as the "current (15-bit) code". On the other hand, each of the 15-bit code supplied from the serial/parallel converter 301 is a code to be demodulated in the next demodulation cycle, and accordingly denoted by $C_k$ and referred to as the "next (15-bit) code" or "15-bit code $C_k$" the following.

The 0-run length detector 303 detects the 0-run length of the LSB side of the 15-bit code $C_{k-1}$ from the word register 304 by using the bit clock and the word clock. Then, the detector 303 outputs the ending type code (i.e., one of 0 through 3) of the 15-bit code $C_{k-1}$ to the code retriever 305. In this case, the detector 303 refers to the above-mentioned table 4 to see the relationship between the LSB 0-run length and the ending type. It is noted that the 0-run length detector 303 may outputs the LSB 0-run length of the 15-bit code $C_{k-1}$ as it is. In either case, the code retriever 305 obtains the possible states (or subtable numbers) on the basis of the received LSB 0-run length or ending type code by referring to a table like Table 4.

On the other hand, the state calculator 302 outputs information indicative of which of the subtables 0 through 6 the following code $C_k$ has been derived from. FIG. 9 is a diagram showing a table for associating each of the conditional expression groups with a corresponding next state code. In FIG. 9, $C_k$ is the next 15-bit code and expressed in the decimal system. Each of the conditional expression groups is written in the C language. The conditional expressions in the table of FIG. 9 are descriptions of conditions on the next code $C_k$. The state calculator 302 makes a test for each conditional expression group to see if the truth value of the conditional expression group is true. If so, then the state calculator 302 outputs the state code (a numeral from 0 to 6 that appear in the code table 120) associated with the conditional expression group.

FIG. 10 is a diagram visualizing truth values of the conditional expression groups of the table of FIG. 9. In FIG. 10, the vertical direction indicates a 15-bit code space.

Seven columns each labeled with a subtable number correspond to the conditional expression groups of FIG. 9. In each column, a bold line and a black circle indicates a range and a value of the 15-bit code $C_k$ where the code $C_k$ satisfies one of the conditional expressions in the conditional expression group. A white circle on a bold line indicates that the value of the code $C_k$ corresponding to the white circle is excluded from the bold line. As seen from FIG. 10, some of the bold lines overlap one another, which means that the state calculator 302 may output a plurality of state codes for the same 15-bit code $C_k$.

Figure 11:
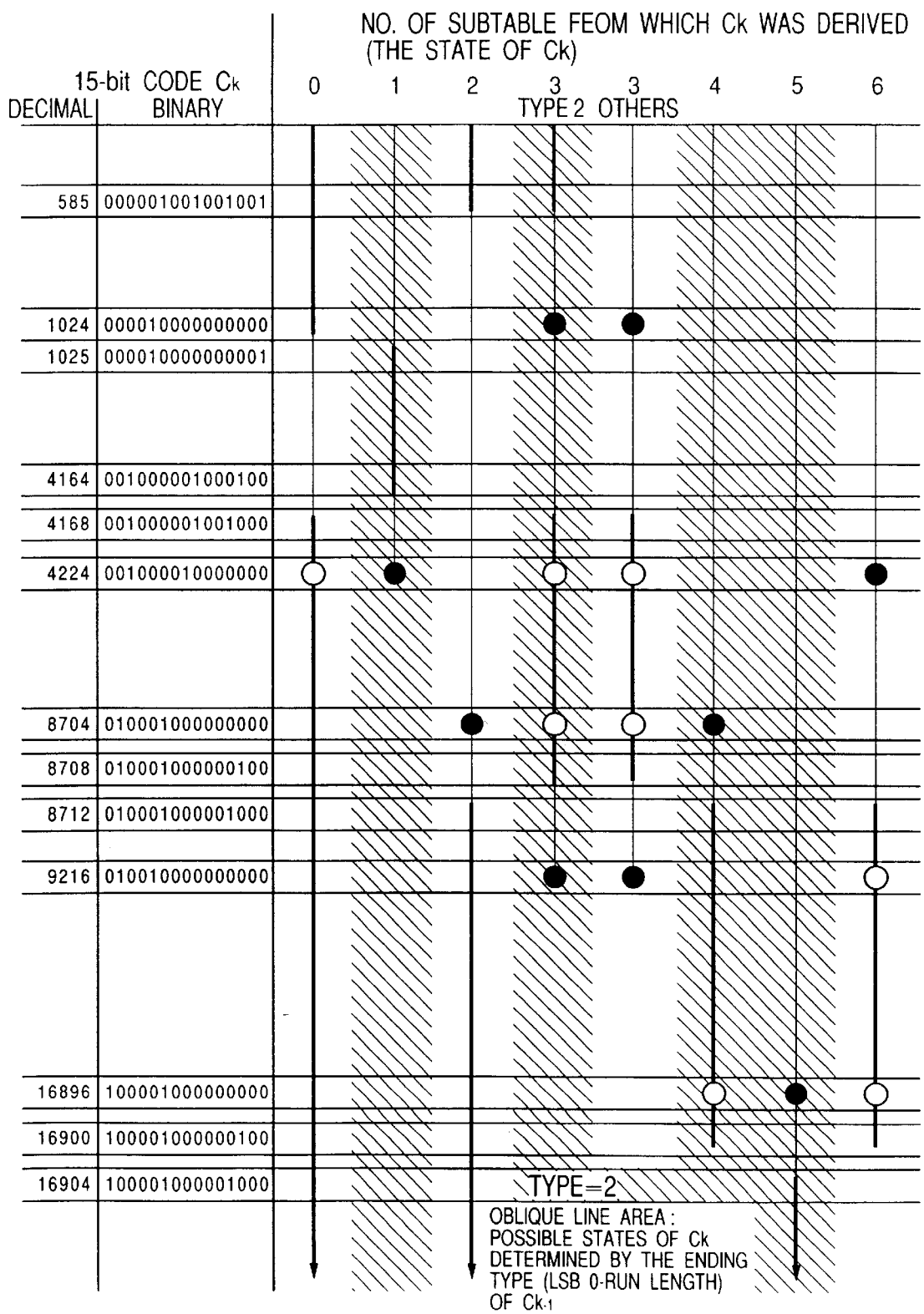
FIG. 11 is a diagram showing the way of determining the state of the code $C_k$ from the state codes from the state calculator 302 and the possible states obtained from table 3 by using the ending type code for the code $C_{k-1}$.

For this reason, the code retriever 305 narrows the received state codes down into one or few state codes for subtable(s) from which the code $C_k$ was derived by using the possible states obtained on the basis of the received LSB 0-run length or ending type code by referring to a table like Table 4. Specifically, the code retriever 305 uses a state code (or one of state codes) common to the state codes from the state calculator 302 and the obtained possible states. For example, assume that the code retriever 305 receives an ending type code "2". Then, the subtable(s) from which the next 15-bit code $C_k$ was derived is (or are) identified as shown in FIG. 11. FIG. 11 is obtained by marking, in FIG. 10, the columns for states "1", "3 (for an ending type 2)", "4" and "5" assigned to the possible states by Table 4. In FIG. 11, the bold lines and the black circles in the marked column "1", "3 (for an ending type 2)", "4" and "5" are the set of subtables from which the 15-bit code $C_k$ is obtained when the preceding code $C_{k-1}$ is "2" in the ending type. If $C_k \leq 585$ or $1024 \leq C_k < 9216$ or $9216 < C_k$, then only one subtable is obtained (the values of $C_k$ are expressed in the decimal system here).

In this way, the subtable from which the next code $C_k$ was obtained is known (as the next state) in the demodulation cycle for the current code $C_{k-1}$. This means that the code retriever 305 already knows the subtable for the current code $C_{k-1}$ (as the current state) when the retriever 305 demodulates the current code $C_{k-1}$. For this purpose, the code retriever 305 preferably has a current state register or memory 310.

Therefore, in order to obtain a demodulated 8-bit code for the current 15-bit code $C_{k-1}$, it is suffice for the code retriever 305 to search the subtable of the current state for a combination of the current 15-bit code $C_{k-1}$ and the next state and obtain the source code in the row on which the found combination exists.

Figure 12:
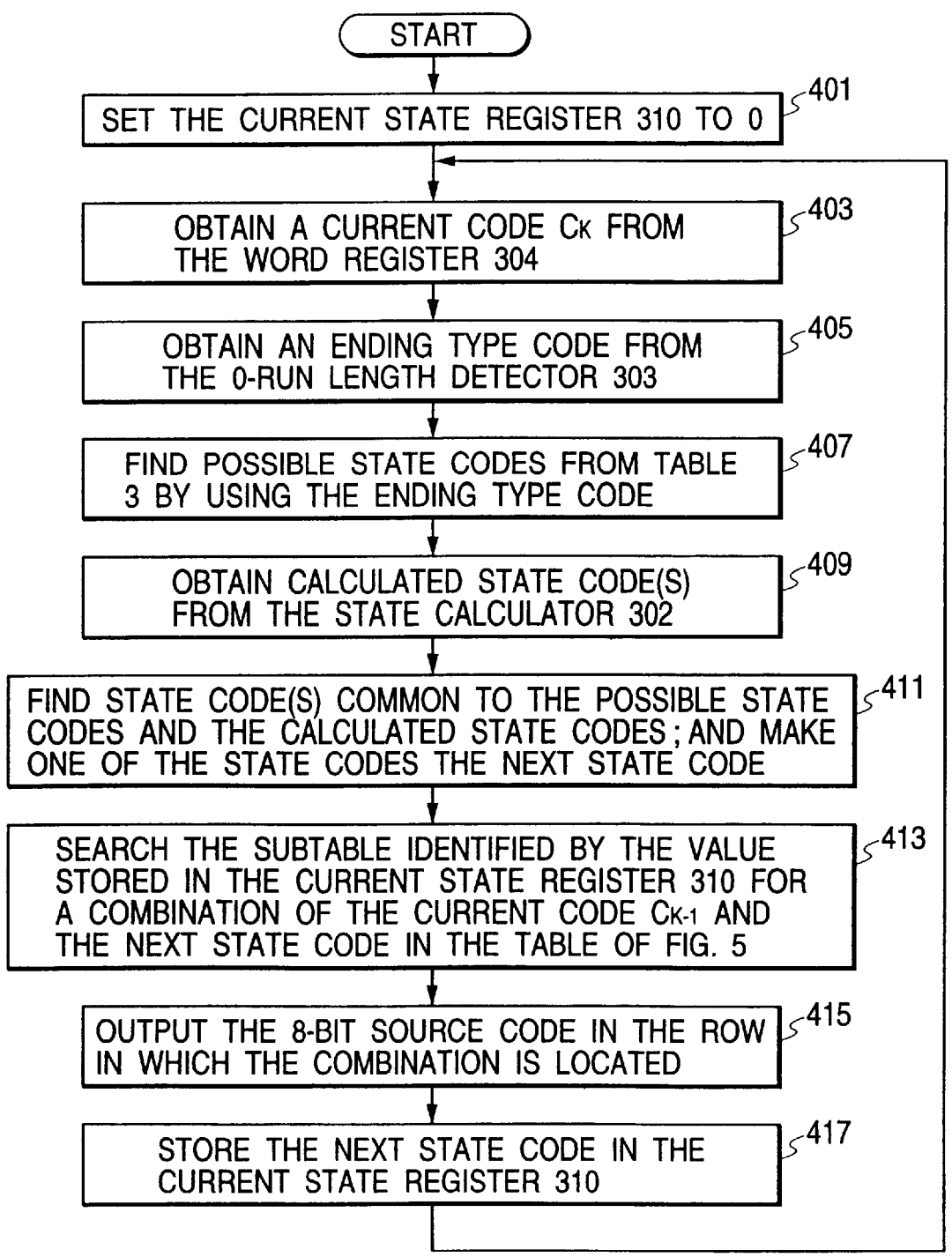
FIG. 12 is a flow chart showing the demodulation operation executed by the code retriever 305.

FIG. 12 is a flow chart showing the demodulation operation executed by the code retriever 305. In FIG. 12, step 401 sets the current state register 310 to 0 as initial setting. Step 403 obtains a current code $C_k$ from the word register 304. Step 405 obtains an ending type code from the 0-run length detector 303. Step 407 finds possible state codes from Table 4 by using the ending type code. Step 409 obtains the calculated state code(s) from the state calculator 302. Step 411 finds state code(s) common to the possible state codes and the calculated state codes and makes the found state code (or one of the found state codes) the next state code. Step 413 searches the subtable identified by the value stored in the current state register 310 for a combination of the current code $C_{k-1}$ and the next state code in the code table of FIG. 5. Step 415 outputs the 8-bit source code in the row in which the found combination is located. Step 417 stores the next state code in the current state register 310 in preparation for the next demodulation cycle. Then the control is returned to step 403.

In this way, the incoming 15-bit codes are demodulated into 8-bit source code by the 15-to-8 demodulator 33.

Figure 13:
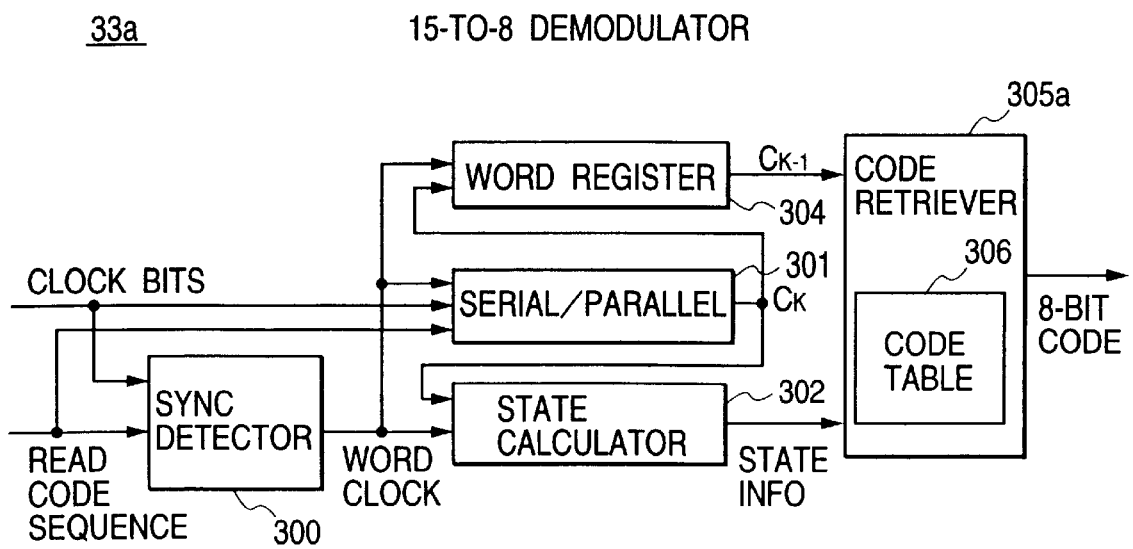
FIG. 13 is a schematic block diagram showing an arrangement of another embodiment of the 15-to-8 demodulator 33 of FIG. 7.

FIG. 13 is a schematic block diagram showing an arrangement of another embodiment of the 15-to-8 demodulator 33 of FIG. 7. The demodulator of FIG. 10 is identical to that of FIG. 8 except the following: the 0-run length detector 303 has been eliminated; and the code retriever 305 and the code table 120 have been replaced with the code retriever 305a and the code table 306 in the 15-to-8 demodulator 33a.

FIG. 14 shows a code table for use in the demodulator 33a of FIG. 10. In FIG. 11, the decimal expression, the binary expression and the ending type code of each of the possible current 15-bit codes $C_{k-1}$ are listed in the first through third columns from the left. In the remaining seven columns labeled with respective state codes (provided by the state calculator 302 as described), demodulated data (decimal expressions of 8-bit binary codes) are listed and associated in the row direction with the corresponding current codes $C_{k-1}$. Error propagation is in two bytes.

Specific examples are shown in the following. It is assumed that the demodulator 33a receives

| | |
|---|---|
| 000000000100000 | (32 in decimal) |
| 010001000000000 | (8704 in decimal) |
| 100001000001000 | (16904 in decimal) | in this order. Then, since the ending type of the first code "32" in decimal is "2" (from E-TYPE column of the table 306), the possible states of the next code ("8704" in this case) are "1", "3", "4" and "5".

Accordingly, the first code can be decoded from the table 306 of FIG. 14 if we know which of the possible states "1", "3", "4" and "5" the next code "8704" has been obtained from. Since the code retriever 305a finds, from the possible states and the state code(s) obtained from the state calculator (in this case "0", "2" and "4" from FIG. 10), that the state of the next code 8704 is "4", the code retriever 305a outputs the data listed in the row "32" and the column labeled "4" of the code table 306, i.e., "0" as an 8-bit output code from the 15-to-8 demodulator 33a.

Similarly, since the possible states of the third code "16904" are "3" through "6" (from the ending type "3" of the second code) and the state codes obtained from the state calculator 302 are "0", "2" and "5" see FIG. 10, the next state code of the next (or third) code "16904" is "5". Accordingly, the code retriever 305a outputs the data in the row "8704" and the column "5", i.e. "1" as the 8-bit demodulated code for the second code "8704". Thus, according to the demodulating system of the invention, the current 15-bit code $C_{k-1}$, can be demodulated into an 8-bit source code on the basis of the current code $C_{k-1}$ and the next code $C_k$.

Many widely different embodiments of the present invention may be constructed without departing from the spirit and scope of the present invention. It should be understood that the present invention is not limited to the specific embodiments described in the specification, except as defined in the appended claims.

What is claimed is:

1. A code table for use in converting each source code of a p-bit source code sequence into a q-bit (p<q) object code whose NRZI-converted version satisfies predetermined run-length-limited (RLL) constraints in a p-to-q modulator which simply concatenates the converted q-bit object codes into a q-bit object code sequence that still satisfies the run-length limited constraints, the code table comprising;

a column for storing $2^p$ possible p-bit source codes in order of magnitude; and a plurality of columns (hereinafter referred to as "subtables"), each subtable comprising a subtable ID for identifying said subtable and $2^p$ combinations of q-bit object codes and respective next subtable fields which combinations are associated in the row directions with respective source codes, each of said next subtable fields containing a subtable ID of a subtable to be used in a modulation of a next source of said source code sequence so as to cause said source code sequence to satisfy said RLL constraints, and selected object codes appearing repeatedly in said q-bit object codes in each subtable such that combinations of appearances of each of said selected object codes and respective next subtable fields are unique in said subtable, and wherein said subtables include at least one group of a first subtable and at least one second subtable such that said first subtable is usable in place of said at least one second subtable for source codes of said $2^p$ source codes that are in a predetermined range and that, for each of said source codes in said predetermined range, the number of "1" symbols of two corresponding object codes of said first subtable and each of said at least one second subtable is an odd number.

2. A code table as defined in claim 1, wherein said q-bit object codes are classified by a plurality of ending types, said ending types being associated with respective ranges of the 0-run length on the LSB (least significant bit) side of said object codes such that said ranges do not overlap each other, wherein subtable ID's of subtables possible to each ending type are assigned to the ending type, permitting subtable ID to be assigned to a plurality of adjacent ending types, and wherein said ending type includes such a special ending type that at least one of subtables assigned to said special ending type includes object codes replaceable by corresponding object codes of a subtable which is used for a modulation of the first source code of said p-bit source code sequence.

3. A code table as defined in claim 1, wherein p and q are 8 and 15, respectively and wherein said RLL constraints are such that the run lengths of an NRZI converted signal of an object code sequence are limited to 3T through 11T, where T is a channel bit period of each object code.

4. A code table as defined in claim 2, wherein p and q are 8 and 15, respectively and wherein said RLL constraints are such that the run lengths of an NRZI converted signal of an object code sequence are limited to 3T through 11T, where T is a channel bit period of each object code.

5. A method of modulating a p-bit source code sequence into a q-bit (p<q) object code sequence which includes no merging bit and whose NRZI converted version satisfies predetermined run-length-limited constraints in a p-to-q modulator provided with a code table comprising a column for storing $2^p$ possible p-bit source codes in order of magnitude and a plurality of columns (hereinafter referred to as "subtables"), each subtable comprising a subtable ID for identifying the subtable and $2^p$ combinations of q-bit object codes and respective next subtable fields which combinations are associated in the row directions with respective source codes, each of said next subtable fields containing a subtable ID of a subtable to be used in a modulation of a next source of said source code sequence so as to cause said source code sequence to satisfy said RLL constraints, and selected object codes appearing repeatedly in said q-bit object codes in each subtable such that combinations of appearances of each of said selected object codes and respective next subtable fields are unique in the subtable, and wherein said plurality of subtables include at least one group of a first subtable and at least one second subtable such that said first subtable is usable in place of said at least one second subtable for source codes of said $2^p$ source codes that are in a predetermined range and that, for each of said source codes in said predetermined range, the number of "1" symbols of two corresponding object codes of said first subtable and each of said at least one second subtable is an odd number, the method comprising the steps of:

retrieving a first object code associated with a source code of said source code sequence from a subtable identified by a next subtable field attached to the last modulated object code;

making a test to see if said subtable identified by said next subtable field is one of said at least one second subtable and said source code is in said predetermined range;

in response to a pass in said test, retrieving a second object code associated with said source code of said source code sequence from said first subtable;

calculating a first digital sum value (DSV) and a second DSV by using said first object code and said second object code, respectively;

if the absolute value of said second DSV is smaller than that of said first DSV, including said second object code in said q-bit object code sequence; and if said test is unsuccessful or if the absolute of said second DSV is not smaller than that of said first DSV, including said first object code in said q-bit object code sequence.

6. A method as defined in claim 5, wherein said q-bit object codes are classified by a plurality of ending types, said ending types being associated with respective ranges of the 0-run length on the LSB (least significant bit) side of said object codes such that said ranges do not overlap each other, wherein subtable ID's of subtables possible to each ending type are assigned to the ending type, permitting subtable ID to be assigned to a plurality of adjacent ending types, wherein said ending type includes such a special ending type that at least one of subtables assigned to said special ending type includes object codes replaceable by corresponding object codes of a special subtable which is used for a modulation of the first source code of said p-bit source code sequence, and wherein the method further comprises the steps of:

making a second test to see if an object code for a previous source code a code before said source code is of said special ending type and if using said special subtable for a modulation of said source code satisfies said RLL constraints; and in response to a pass in said second test, retrieving a second object code associated with said source code of said source code sequence from said special subtable, and wherein said step of including said first object code comprises the step of, if both of said test and said second test are unsuccessful or if the absolute value of said second DSV is not smaller than that of said first DSV, including said first object code in said q-bit object code sequence.

7. A method as defined in claim 5, wherein p and q are 8 and 15, respectively and wherein said RLL constraints are such that the run lengths of an NRZI converted signal of an object code sequence are limited to 3T through 11T, where T is a channel bit period of each object code.

8. A method as defined in claim 6, wherein p and q are 8 and 15, respectively and wherein said RLL constraints are such that the run lengths of an NRZI converted signal of an object code sequence are limited to 3T through 11T, where T is a channel bit period of each object code.

9. A method as defined in claim 5, further comprising the steps of:

storing said first DSV and said second DSV in a first and second locations, respectively;

prior to said step of calculating said first DSV and said second DSV, comparing a first absolute value of a first DSV stored in said first location and a second absolute value of a second DSV stored in said second location, in response to said pass in said test, appending said first and second object codes to a first output code queue and a second output code queue, respectively; and in response to a failure in said test, appending said first object code to said first output code queue and said second output code queue, wherein said step of including said second object code comprises the step of, if said second absolute value is smaller than said first absolute value, outputting the contents of said second output code queue, and wherein said step of including said first object code comprises the step of, if said test is successful or if said second absolute value is not smaller than said first absolute value, outputting the contents of said first output code queue.

10. A method of demodulating a q-bit code sequence into a p-bit (p<q) code sequence in a q-to-p demodulator provided with a code table comprising a column for storing $2^p$ possible p-bit codes in order of magnitude and a plurality of columns (hereinafter referred to as "subtables"), each subtable comprising a subtable ID for identifying the subtable and $2^p$ combinations of q-bit codes and respective next subtable fields which combinations are associated in the row directions with respective p-bit codes, each of said next subtable fields containing a subtable ID of a subtable to be used in a modulation of a next p-bit code of said p-bit code sequence so as to cause said p-bit code sequence to satisfy said RLL constraints, and selected q-bit codes appearing repeatedly in said q-bit codes in each subtable such that combinations of appearances of each of said selected q-bit codes and respective next subtable fields are unique in the subtable, and wherein the q-to-p demodulator is further provided with means based on a value of a next q-bit code following a current q-bit code for calculating at least one subtable from which said next q-bit code is derivable to provide a calculated subtable ID's and a possible state table for associating each of ending types determined by respective ranges of the 0-run length on the LSB (least significant bit) side (hereinafter, referred to as "LSB 0-run length") of said current q-bit codes with ID's of possible subtables compatible with the ending type, the method comprising the steps of:

finding ID's of said compatible subtables based on said LSB 0-run length of said current q-bit code;

obtaining said calculated subtable ID's from said means;

finding, as a next subtable ID for said next q-bit code, an ID common to said ID's of said compatible subtables and said calculated subtable ID's;

searching, a subtable identified by a next subtable ID for said current q-bit code, for a combination of said current q-bit code and said next subtable ID for said next q-bit code; and outputting a p-bit code in a row in which said combination is located.

11. A method of demodulating a q-bit code sequence into a p-bit (p<q) code sequence in a q-to-p demodulator provided with means based on a value of a next q-bit code following a current q-bit code for calculating at least one subtable from which said next q-bit code is derivable to provide a calculated subtable ID's and a decoding table for associating each of possible q-bit current codes with an ending type and corresponding p-bit codes further associated with respective subtable ID's for use in a demodulation of said next q-bit code, the method comprising the steps of:

finding ID's of compatible subtables based on said ending type associated with said q-bit current codes;

obtaining said calculated subtable ID's from said means;

finding, as a next subtable ID for said next q-bit code, an ID common to said ID's of said compatible subtables and said calculated subtable ID's; and obtaining a p-bit code associated with said current q-bit code and said next subtable ID for said next q-bit code and outputting said obtained p-bit code.

12. A system for modulating a p-bit source code sequence into a q-bit (p<q) object code sequence which includes no merging bit and whose NRZI converted version satisfies predetermined run-length-limited constraints, the system comprising:

a code table comprising a column for storing $2^p$ possible p-bit source codes in order of magnitude and a plurality of columns (hereinafter referred to as "subtables"), each subtable comprising a subtable ID for identifying the subtable and $2^p$ combinations of q-bit object codes and respective next subtable fields which combinations are associated in the row directions with respective source codes, each of said next subtable fields containing a subtable ID of a subtable to be used in a modulation of a next source of said source code sequence so as to cause said source code sequence to satisfy said RLL constraints, and selected object codes appearing repeatedly in said q-bit object codes in each subtable such that combinations of appearances of each of said selected object codes and respective next subtable fields are unique in the subtable, and said plurality of subtables including at least one group of a first subtable and at least one second subtable such that said first subtable is usable in place of said at least one second subtable for source codes of said $2^p$ source codes that are in a predetermined range and that, for each of said source codes in said predetermined range, the number of "1" symbols of two corresponding object codes of said first subtable and each of said at least one second subtable is an odd number;

means for retrieving a first object code associated with a source code of said source code sequence from a subtable identified by a next subtable field attached to the last modulated object code;

means for making a test to see if said subtable identified by said next subtable field is one of said at least one second subtable and said source code is in said predetermined range;

means, responsive to a pass in said test, for retrieving a second object code associated with said source code of said source code sequence from said first subtable;

means for calculating a first digital sum value (DSV) and a second DSV by using said first object code and said second object code, respectively;

means, responsive to a determination that the absolute value of said second DSV is smaller than that of said first DSV, for including said second object code in said q-bit object code sequence; and means, responsive to either a determination that said test is unsuccessful or a determination that the absolute of said second DSV is not smaller than that of said first DSV, for including said first object code in said q-bit object code sequence.

13. A system as defined in claim 12, wherein said q-bit object codes are classified by a plurality of ending types, said ending types being associated with respective ranges of the 0-run length on the LSB (least significant bit) side of said object codes such that said ranges do not overlap each other, wherein subtable ID's of subtables possible to each ending type are assigned to the ending type, permitting subtable ID to be assigned to a plurality of adjacent ending types, wherein said ending type includes such a special ending type that at least one of subtables assigned to said special ending type includes object codes replaceable by corresponding object codes of a special subtable which is used for a modulation of the first source code of said p-bit source code sequence, and wherein the system further comprises:

means for making a second test to see if an object code for a previous source code a code before said source code is of said special ending type and if using said special subtable for a modulation of said source code satisfies said RLL constraints; and means, responsive to a pass in said second test, for retrieving a second object code associated with said source code of said source code sequence from said special subtable, and wherein said means for including said first object code comprises means, responsive to either a determination that both of said test and said second test are unsuccessful or a determination that the absolute value of said second DSV is not smaller than that of said first DSV, for including said first object code in said q-bit object code sequence.

14. A system as defined in claim 12, wherein p and q are 8 and 15, respectively and wherein said RLL constraints are such that the run lengths of an NRZI converted signal of an object code sequence are limited to 3T through 11T, where T is a channel bit period of each object code.

15. A system as defined in claim 13, wherein p and q are 8 and 15, respectively and wherein said RLL constraints are such that the run lengths of an NRZI converted signal of an object code sequence are limited to 3T through 11T, where T is a channel bit period of each object code.

16. A system as defined in claim 12, further comprising:

means for storing said first DSV and said second DSV in a first and second locations, respectively;

means, operative prior to said means for calculating said first DSV and said second DSV, for comparing a first absolute value of a first DSV stored in said first location and a second absolute value of a second DSV stored in said second location, means, responsive to said pass in said test, for appending said first and second object codes to a first output code queue and a second output code queue, respectively; and means, responsive to a failure in said test, for appending said first object code to said first output code queue and said second output code queue, wherein said means for including said second object code comprises means, in the event said second absolute value is smaller than said first absolute value, for outputting the contents of said second output code queue, and wherein said means for including said first object code comprises means, in the event said test is successful or in the event said second absolute value is not smaller than said first absolute value, for outputting the contents of said first output code queue.

17. A system for demodulating a q-bit code sequence into a p-bit (p<q) code sequence, the system comprising:

a code table comprising a column for storing $2^p$ possible p-bit codes in order of magnitude and a plurality of columns (hereinafter referred to as "subtables"), each subtable comprising a subtable ID for identifying the subtable and $2^p$ combinations of q-bit codes and respective next subtable fields which combinations are associated in the row directions with respective p-bit codes, each of said next subtable fields containing a subtable ID of a subtable to be used in a modulation of a next p-bit code of said p-bit code sequence so as to cause said p-bit code sequence to satisfy said RLL constraints, and selected q-bit codes appearing repeatedly in said q-bit codes in each subtable such that combinations of appearances of each of said selected q-bit codes and respective next subtable fields are unique in the subtable;

calculating means, based on a value of a next q-bit code following a current q-bit code, for calculating at least one subtable from which said next q-bit code is derivable to provide a calculated subtable ID's;

a possible state table for associating each of ending types determined by respective ranges of the 0-run length on the LSB (least significant bit) side (hereinafter, referred to as "LSB 0-run length") of said current q-bit codes with ID's of possible subtables compatible with the ending type;

means for finding ID's of said compatible subtables based on said LSB 0-run length of said current q-bit code;

means for obtaining said calculated subtable ID's from said calculating means;

means for finding, as a next subtable ID for said next q-bit code, an ID common to said ID's of said compatible subtables and said calculated subtable ID's;

means for searching, a subtable identified by a next subtable ID for said current q-bit code, for a combination of said current q-bit code and said next subtable ID for said next q-bit code; and means for outputting a p-bit code in a row in which said combination is located.

18. A system for demodulating a q-bit code sequence into a p-bit (p<q) code sequence, the system comprising:

calculating means, based on a value of a next q-bit code following a current q-bit code, for calculating at least one subtable from which said next q-bit code is derivable to provide a calculated subtable ID's;

a decoding table for associating each of possible q-bit current codes with an ending type and corresponding p-bit codes further associated with respective subtable ID's for use in a demodulation of said next q-bit code;

means for finding ID's of compatible subtables based on said ending type associated with said q-bit current codes;

means for obtaining said calculated subtable ID's from said calculating means;

means for finding, as a next subtable ID for said next q-bit code, an ID common to said ID's of said compatible subtables and said calculated subtable ID's; and means for obtaining a p-bit code associated with said current q-bit code and said next subtable ID for said next q-bit code and outputting said obtained p-bit code.

19. A device having an optical disc player which includes a system for demodulating a q-bit code sequence into a p-bit (p<q) code sequence, the system comprising:

calculating means, based on a value of a next q-bit code following a current q-bit code, for calculating at least one subtable from which said next q-bit code is derivable to provide a calculated subtable ID's;

a decoding table for associating each of possible q-bit current codes with an ending type and corresponding p-bit codes further associated with respective subtable ID's for use in a demodulation of said next q-bit code;

means for finding ID's of compatible subtables based on said ending type associated with said q-bit current codes;

means for obtaining said calculated subtable ID's from said calculating means;

means for finding, as a next subtable ID for said next q-bit code, an ID common to said ID's of said compatible subtables and said calculated subtable ID's; and means for obtaining a p-bit code associated with said current q-bit code and said next subtable ID for said next q-bit code and outputting said obtained p-bit code.

20. An optical disc storing an NRZ1 converted version of a q-bit object code sequence obtained through a method of modulating a p-bit source code sequence into the q-bit (p<q) object code sequence which includes no merging bit and whose NRZI converted version satisfies predetermined run-length-limited constraints in a p-to-q modulator provided with a code table comprising a column for storing $2^P$ possible p-bit source codes in order of magnitude and a plurality of columns (hereinafter referred to as "subtables"), each subtable comprising a subtable ID for identifying the subtable and $2^P$ combinations of q-bit object codes and respective next subtable fields which combinations are associated in the row directions with respective source codes, each of said next subtable fields containing a subtable ID of a subtable to be used in a modulation of a next source of said source code sequence so as to cause said source code sequence to satisfy said RLL constraints, and selected object codes appearing repeatedly in said q-bit object codes in each subtable such that combinations of appearances of each of said selected object codes and respective next subtable fields are unique in the subtable, and wherein said plurality of subtables include at least one group of a first subtable and at least one second subtable such that said first subtable is usable in place of said at least one second subtable for source codes of said $2^P$ source codes that are in a predetermined range and that, for each of said source codes in said predetermined range, the number of "1" symbols of two corresponding object codes of said first subtable and each of said at least one second subtable is an odd number, the method comprising the steps of:

retrieving a first object code associated with a source code of said source code sequence from a subtable identified by a next subtable field attached to the last modulated object code;

making a test to see if said subtable identified by said next subtable field is one of said at least one second subtable and said source code is in said predetermined range;

in response to a pass in said test, retrieving a second object code associated with said source code of said source code sequence from said first subtable;

calculating a first digital sum value (DSV) and a second DSV by using said first object code and said second object code, respectively;

if the absolute value of said second DSV is smaller than that of said first DSV, including said second object code in said q-bit object code sequence; and if said test is unsuccessful or if the absolute of said second DSV is not smaller than that of said first DSV, including said first object code in said q-bit object code sequence.

21. An optical disc as defined in claim 20, wherein p and q are 8 and 15, respectively and wherein said RLL constraints are such that the run lengths of an NRZI converted signal of an object code sequence are limited to 3T through 11T, where T is a channel bit period of each object code.

* * * * *